United States Patent
George

(10) Patent No.: US 8,139,219 B2
(45) Date of Patent: Mar. 20, 2012

(54) APPARATUS AND METHOD FOR SEMICONDUCTOR WAFER ALIGNMENT

(75) Inventor: Gregory George, Colchester, VT (US)

(73) Assignee: Suss Microtec Lithography, GmbH, Garching (DE)

( * ) Notice: Subject to any disclaimer, the term of this patent is extended or adjusted under 35 U.S.C. 154(b) by 464 days.

(21) Appl. No.: 12/416,779

(22) Filed: Apr. 1, 2009

(65) Prior Publication Data
US 2009/0251699 A1 Oct. 8, 2009

Related U.S. Application Data

(60) Provisional application No. 61/041,629, filed on Apr. 2, 2008.

(51) Int. Cl.
*G01B 11/00* (2006.01)

(52) U.S. Cl. ........ 356/401; 356/399; 356/400; 257/347; 385/455; 385/618

(58) Field of Classification Search .......... 356/399–401; 257/347; 438/455, 618
See application file for complete search history.

(56) References Cited

U.S. PATENT DOCUMENTS

| | | | |
|---|---|---|---|
| 5,187,519 A * | 2/1993 | Takabayashi et al. | 355/53 |
| 6,774,981 B1 * | 8/2004 | Watson et al. | 355/53 |
| 2007/0111471 A1 * | 5/2007 | Okada | 438/455 |
| 2007/0296035 A1 * | 12/2007 | George et al. | 257/347 |

* cited by examiner

*Primary Examiner* — Tarifur Chowdhury
*Assistant Examiner* — Isiaka Akanbi
(74) *Attorney, Agent, or Firm* — Aliki K. Collins; AKC Patents LLC

(57) ABSTRACT

An apparatus for aligning semiconductor wafers includes equipment for positioning a first surface of a first semiconductor wafer directly opposite to a first surface of a second semiconductor wafer and equipment for aligning a first structure on the first semiconductor wafer with a second structure on the first surface of the second semiconductor wafer. The aligning equipment comprises at least one movable alignment device configured to be moved during alignment and to be inserted between the first surface of the first semiconductor wafer and the first surface of the second semiconductor wafer. The positioning equipment are vibrationally and mechanically isolated from the alignment device motion.

36 Claims, 25 Drawing Sheets

APPARATUS AND METHOD FOR SEMICONDUCTOR WAFER ALIGNMENT

CROSS REFERENCE TO RELATED CO-PENDING APPLICATIONS

This application claims the benefit of U.S. provisional application Ser. No. 61/041,629 filed Apr. 2, 2008 and entitled "APPARATUS AND METHOD FOR SEMICONDUCTOR WAFER ALIGNMENT", the contents of which are expressly incorporated herein by reference.

FIELD OF THE INVENTION

The present invention relates to an apparatus and a method for semiconductor alignment, and more particularly to an interwafer wafer-to-wafer alignment that provides nanometer range alignment accuracy.

BACKGROUND OF THE INVENTION

Alignment of semiconductor wafers is usually achieved by utilizing mechanical or optical fiducial marks, such as notches at the edges of wafers, pins, e-beam etchings, or holographic images, among others. Mechanical alignment marks provide millimeter range alignment accuracy, while optical marks provide micron to submicron alignment accuracy.

In several semiconductor processes, such as 3-D integration, bonding and mask alignment, among others, submicron to nanometer alignment accuracy is desirable.

SUMMARY OF THE INVENTION

A wafer-to-wafer alignment apparatus and method according to this invention utilize microscopes that are inserted between two wafers to be aligned parallel to each other. This "interwafer" alignment method can be used for any type of wafer material, transparent or not transparent, uses visible light and does not require fiducial marks at the back of the wafers. The alignment accuracy is of the order of a few hundred nanometers.

In general, in one aspect, the invention features an apparatus for aligning semiconductor wafers including equipment for positioning a first surface of a first semiconductor wafer directly opposite to a first surface of a second semiconductor wafer and equipment for aligning a first structure on the first semiconductor wafer with a second structure on the first surface of the second semiconductor wafer. The aligning equipment comprises at least one movable alignment device configured to be moved during alignment and to be inserted between the first surface of the first semiconductor wafer and the first surface of the second semiconductor wafer.

Implementations of this aspect of the invention may include one or more of the following features. The positioning equipment are vibrationally and mechanically isolated from the alignment equipment. The apparatus may further include an inverted U-shaped frame and a vibration isolated base. The inverted U-shaped frame is supported on a top surface of the base. The inverted U-shaped frame includes left and right vertical columns and a horizontal beam comprising left and right ends. Each of the column tops comprises two parallel vertical slots extending from the column top surface toward the column center and the two vertical slots are separated by a center block. The center block extends from the bottom of the slots toward the column top and has a height less than the height of the vertical slots thereby forming a gap between the two vertical slots near the column top surface. The left and right ends of the horizontal beam are supported upon the center blocks of the left and right vertical columns, respectively. The apparatus may further include an XYZ stage supporting the movable alignment device and the XYZ stage is configured to slide along the horizontal beam and be supported by the horizontal beam. The movable alignment device includes an optical microscope assembly including an elongated tube and first and second optical microscopes arranged coaxially within the elongated tube along a first axis. The first and second optical microscopes are configured to obtain first and second images of the first and second structures, respectively. The first and second images of the first and second structures are used to determine coordinates of the first and second structures relative to fixed top and bottom reference marks and to guide the positioning equipment for aligning the first surfaces of the first and second semiconductor wafers parallel to each other. The apparatus further includes a microscope calibration reference unit including fixed top and bottom reference marks. The calibration reference unit may be attached to one of the vertical columns. The optical microscope assembly may further include a mirror plane arranged so that the first axis is parallel to the mirror plane. The apparatus may further include pattern recognition software used to analyze the first and second images of the first and second structures, respectively, and to determine their coordinates relative to the fixed top and bottom reference marks. The positioning equipment includes a lower support block and an upper supporting block. The lower supporting block includes a lower wafer plate supporting the first semiconductor wafer and the upper supporting block includes an upper wafer plate supporting the second semiconductor wafer and a plate leveling system for leveling the upper wafer plate. The plate leveling system includes a spherical wedge error compensation mechanism that rotates and/or tilts the upper wafer plate around a center point corresponding to the center of the second semiconductor wafer without translation. The lower support block includes a coarse X-Y-T stage, an air bearing Z-stage carried by the coarse X-Y-T stage and a fine X-Y-T stage carried on top of the Z-stage, and wherein the X-Y-T fine stage carries the lower wafer plate. The X-Y-T coarse stage further includes one or more position sensors for measuring the X-Y-T distance between the coarse X-Y-T stage and the fine X-Y-T stage. The position sensors may be capacitance gauges. The upper and lower wafer plates comprise materials having a CTE matching the semiconductor wafer CTE. The apparatus may further include a fixture for transporting the first and second semiconductor wafers. The fixture includes an outer ring supporting a lower wafer carrier chuck and three or more clamp/spacer assemblies arranged at the periphery of the outer ring. Each of the clamp/spacer assemblies includes a clamp and a spacer. The clamp and the spacer are configured to be moved independent from each other and from the motion of clamps or spacers of the other assemblies and the motion is precise and repeatable both at room and high temperatures. The fixture further may further include a center pin for pinning together the centers of the first and second semiconductor wafers. The first semiconductor wafer is placed upon the lower wafer carrier chuck, the spacers are inserted on top of the edge of the first semiconductor wafer surface and then the second semiconductor wafer is placed on top of the spacers and then the first and second semiconductor wafers are clamped together via the clamps.

In general, in another aspect, the invention features an apparatus for aligning semiconductor wafers including equipment for positioning a first surface of a first semiconductor wafer directly opposite to a first surface of a second semiconductor wafer and equipment for aligning a first structure on the first semiconductor wafer with a second structure on the first surface of the second semiconductor wafer. The aligning equipment includes at least one movable alignment device configured to be moved during alignment. The positioning equipment are vibrationally and mechanically isolated from the alignment device motion.

In general, in another aspect, the invention features a method for aligning semiconductor wafers including positioning a first surface of a first semiconductor wafer directly opposite to a first surface of a second semiconductor wafer, providing alignment equipment comprising at least one movable alignment device and then aligning a first structure on the first semiconductor wafer with a second structure on the first surface of the second semiconductor wafer by inserting the movable alignment device between the first surface of the first semiconductor wafer and the first surface of the second semiconductor wafer.

Implementations of this aspect of the invention may include one or more of the following features. The positioning step is vibrationally and mechanically isolated from the inserting of the movable alignment device between the first surface of the first semiconductor wafer and the first surface of the second semiconductor wafer. The movable alignment device includes an optical microscope assembly including an elongated tube and first and second optical microscopes arranged coaxially within the elongated tube along a first axis. The first and second optical microscopes are configured to obtain first and second images of the first and second structures, respectively. The first and second images of the first and second structures are used to determine coordinates of the first and second structures relative to fixed top and bottom reference marks and to guide the positioning equipment for aligning the first surfaces of the first and second semiconductor wafers parallel to each other. The apparatus further includes a microscope calibration reference unit including fixed top and bottom reference marks. The calibration reference unit may be attached to one of the vertical columns. The optical microscope assembly may further include a mirror plane arranged so that the first axis is parallel to the mirror plane. The method may further include providing pattern recognition software for analyzing the first and second images of the first and second structures, respectively, and determining their coordinates relative to the fixed top and bottom reference marks. The positioning step may include providing a lower support block comprising a lower wafer plate and placing the first semiconductor wafer upon the lower wafer plate and then providing an upper supporting block comprising an upper wafer plate for supporting the second semiconductor wafer and a plate leveling system for leveling the upper wafer plate. The plate leveling system may include a spherical wedge error compensation mechanism that rotates and/or tilts the upper wafer plate around a center point corresponding to the center of the second semiconductor wafer without translation. The lower support block includes a coarse X-Y-T stage, an air bearing Z-stage carried by the coarse X-Y-T stage and a fine X-Y-T stage carried on top of the Z-stage, and wherein the X-Y-T fine stage carries the lower wafer plate. The X-Y-T coarse stage further includes one or more position sensors for measuring the X-Y-T distance between the coarse X-Y-T stage and the fine X-Y-T stage. The apparatus may further include a fixture for transporting the first and second semiconductor wafers. The fixture includes an outer ring supporting a lower wafer carrier chuck and three or more clamp/spacer assemblies arranged at the periphery of the outer ring. Each of the clamp/spacer assemblies includes a clamp and a spacer. The clamp and the spacer are configured to be moved independent from each other and from the motion of clamps or spacers of the other assemblies and the motion is precise and repeatable both at room and high temperatures. The fixture further may further include a center pin for pinning together the centers of the first and second semiconductor wafers. The aligning of the first structure with the second structure includes the following steps. First, placing the first semiconductor wafer upon the lower support block with its first surface facing up. Next, supporting the second semiconductor wafer by the upper wafer plate with its first surface facing down. Next, inserting the optical microscope assembly into the fixed reference unit and focusing the first and second optical microscopes onto the fixed bottom and top reference marks, respectively. Next, using the pattern recognition software to determine position and distance of the fixed top and bottom reference marks and the mirror plane angular position. Next, inserting the optical microscope assembly between the first surfaces of the first and second semiconductor wafers, and focusing the second optical microscope onto the second structure of the second semiconductor wafer and then locking the optical microscope assembly position. Next, moving the coarse X-Y-T stage and Z-stage to focus the first microscope onto the first structure of the first semiconductor wafer and locking coarse X-Y-T and Z stages. Next, using the pattern recognition software to determine position coordinates of the first and second structures and determine their offsets. Finally, moving fine X-Y-T stage by the amount of the determined offsets and an amount determined by a global calibration method, thereby bringing the first and second structures in alignment with each other. The alignment of the first and second structures may further include the following. Moving the optical microscope assembly out from in between the first surfaces of the first and second semiconductor wafers and then moving the Z-stage up while maintaining the fine X-Y-T stage alignment with feedback from the position sensors. Next, bringing the first surface of the first semiconductor wafer in contact with the first surface of the second semiconductor wafer, then clamping the first and second semiconductor wafers together and then unloading the aligned first and second semiconductor wafers. After supporting the second semiconductor wafer by the upper wafer plate the method may further include moving the Z-stage up to bring the spacers on top of the first semiconductor wafer first surface in contact with the second semiconductor first surface. Next, performing wedge error compensation of the second semiconductor wafer under force feedback control and locking the wedge position and then moving the first semiconductor wafer down and removing the spacers.

The details of one or more embodiments of the invention are set forth in the accompanying drawings and description below. Other features, objects and advantages of the invention will be apparent from the following description of the preferred embodiments, the drawings and from the claims.

BRIEF DESCRIPTION OF THE DRAWINGS

Referring to the figures, wherein like numerals represent like parts throughout the several views.

DETAILED DESCRIPTION OF THE INVENTION

Figure 1:
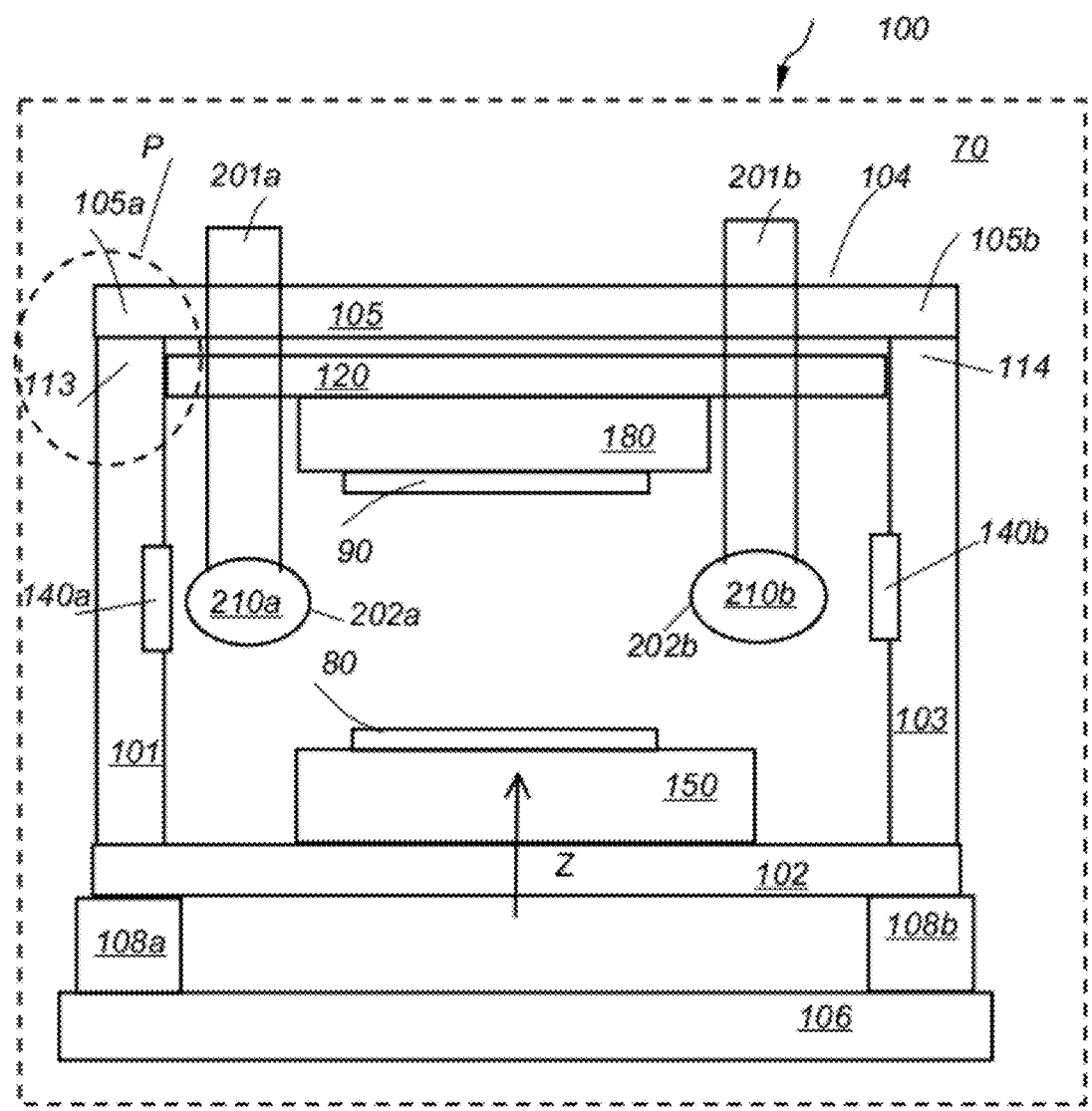
FIG. 1 is a schematic diagram of an aligner system according to this invention.
Figure 2:
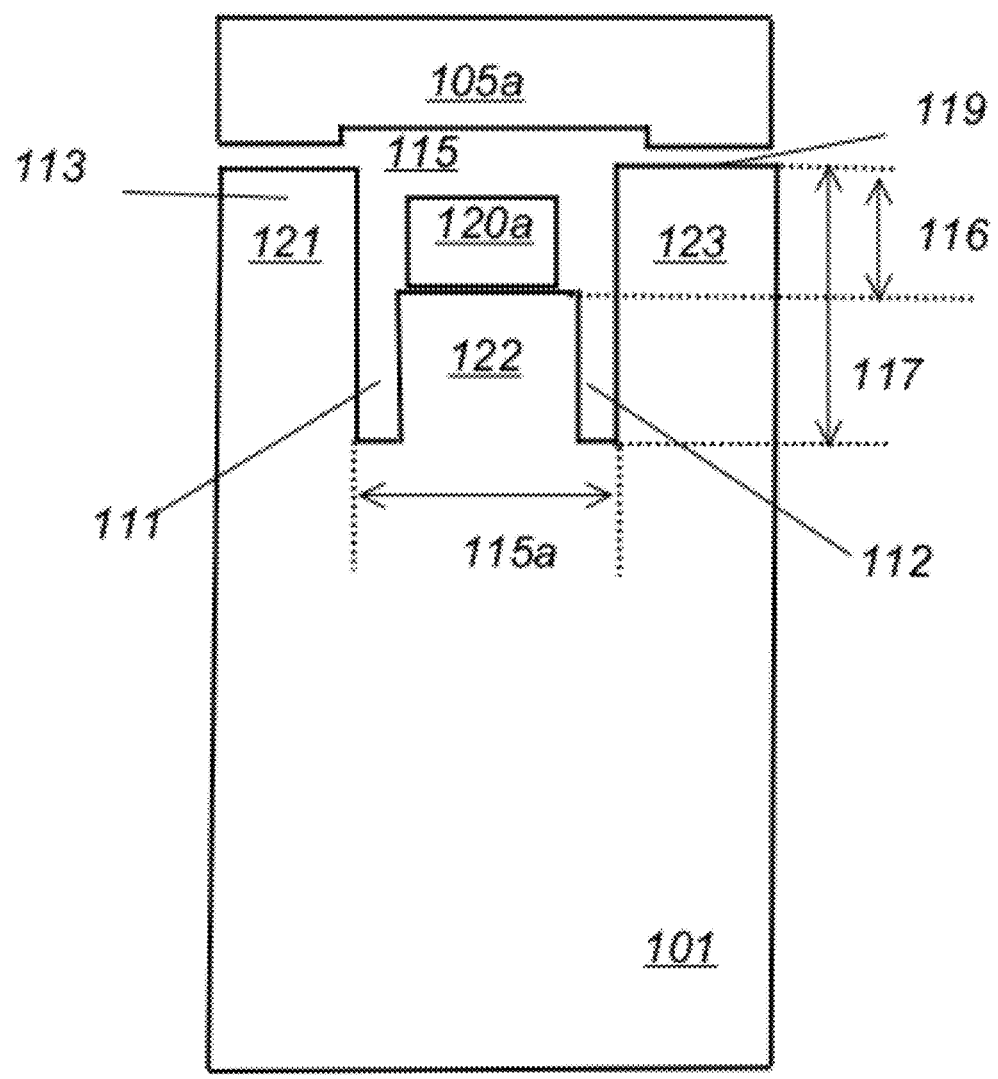
FIG. 2 is a detailed side view of area P of FIG. 1.
Figure 6:
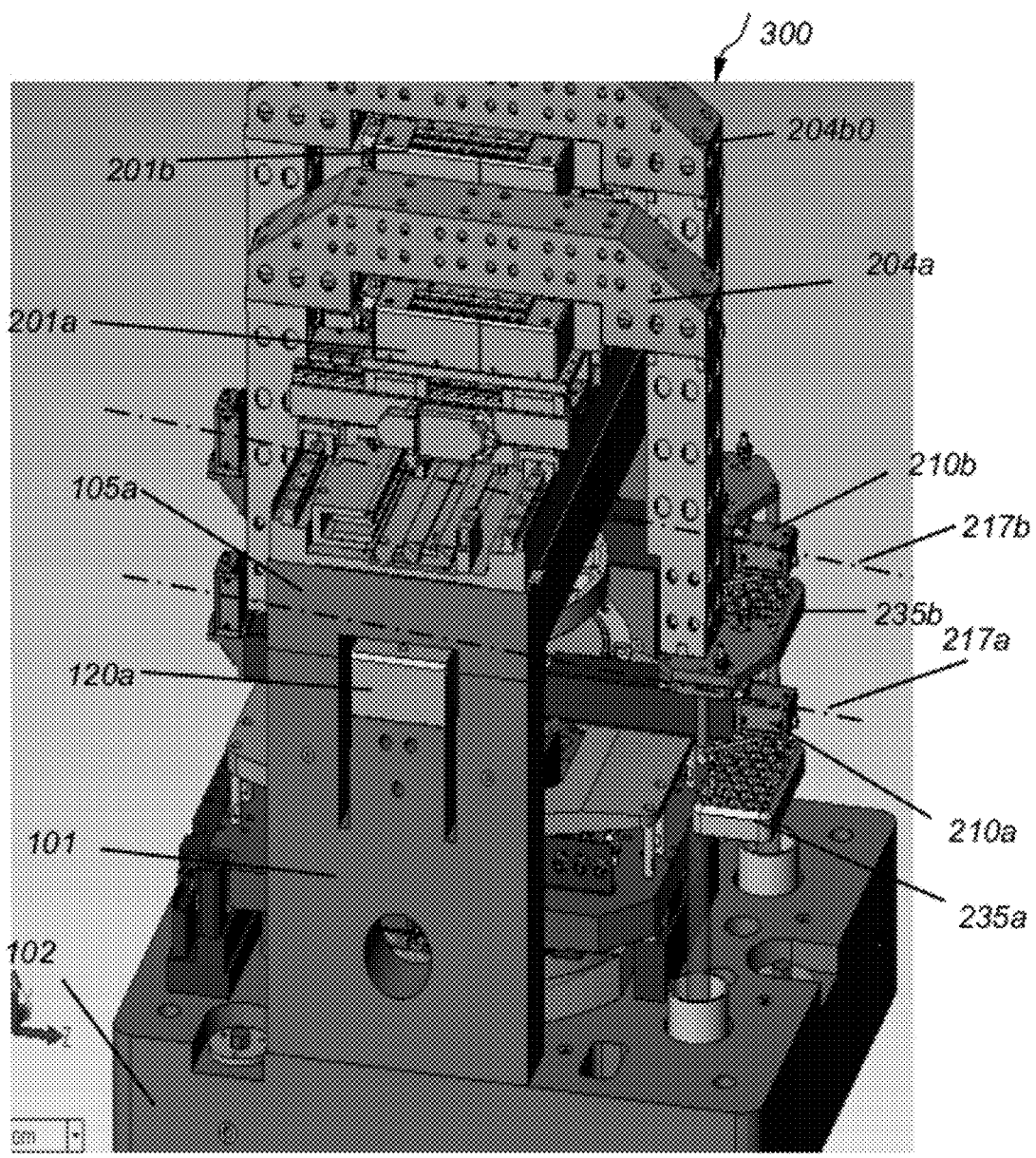
FIG. 6 is a perspective side view of the aligner apparatus of FIG. 3.
Figure 7:
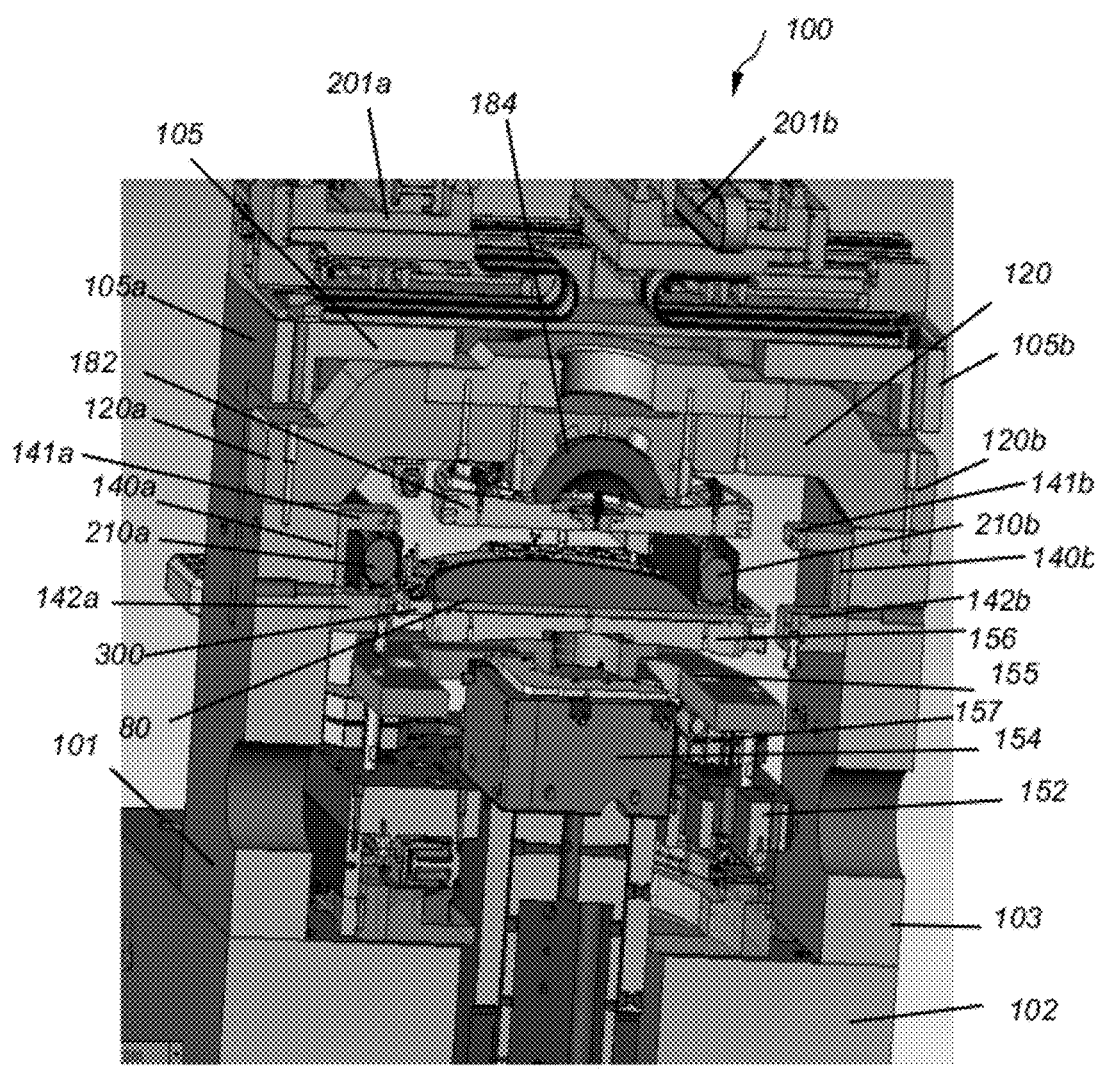
FIG. 7 is a front cross-sectional view of the aligner apparatus of FIG. 3.

Referring to FIG. 1-FIG. 5 a wafer alignment apparatus 100, includes a base 102 supporting an inverted U-shaped frame 104, first and second microscope sets 210a, 210b, a lower wafer support block 150 supporting a lower wafer 80 and an upper wafer support block 180 holding an upper wafer 90. Base 102 is made of a solid material and is supported on a table 106 via four vibration isolating legs 108a, 108b, 108c, 108d. In one example, base 102 is a rectangular shaped block made of granite material. In other examples, base 102 may be made of metal or ceramic material and may have a honeycomb structure. The inverted U-shaped frame 104 includes left and right vertical legs 101, 103 respectively, and a beam 105 supported on the tops 113, 114 of the left and right legs 101, 103, respectively. Each of the leg tops 113, 114 includes two vertical slots 111, 112 extending from the top surface 119 of the leg toward the center of the leg, as shown in FIG. 2. Vertical slots 111, 112 divide the top of each leg 101, 103, respectively, into three separate block extensions 121, 122, 123, also shown in FIG. 2. The ends 105a, 105b of beam 105 are fixedly attached to the outer two block extensions 121, 123 of each leg 101, 103. Vertical slots 111, 112 of each leg 101, 103 are spaced apart by a distance 115a and a gap 115 is formed between them, as shown in FIG. 2. Gap 115 extends from the top surface 119 of the leg, has a height 116 less than the height 117 of the slots 111 and 112 and the same width as the distance 115a between the slots 111 and 112. Gap 115 is dimensioned to receive a support bar 120 extending from the top 113 of left leg 101 to the top 114 of right leg 103, as shown in FIG. 7. Left and right ends 120a, 120b of support bar 120 are placed within the gaps 115 of the left and right legs 101, 103, respectively, and are fixedly attached to the inner blocks 122, as shown in FIG. 6 and FIG. 2. In this type of arrangement there is no contact between the ends 105a, 105b of the frame beam 105 and the ends 120a, 120b, of support bar 120. Frame beam 105 supports two separate sets of microscope X-Y-Z stages 201a, 201b controlling the motion of the two microscope sets 210a, 210b, respectively. The upper wafer support block 180 is fixedly attached to support bar 120. The lack of contact between the ends 105a, 105b of the frame beam 105 and the ends 120a, 120b, of support bar 120 isolates the frame beam 105 from the support bar 120 and prevents the transfer of vibrations due to the microscope stage motion to the upper wafer support block 180 and therefore to the upper wafer 90.

Figure 3:
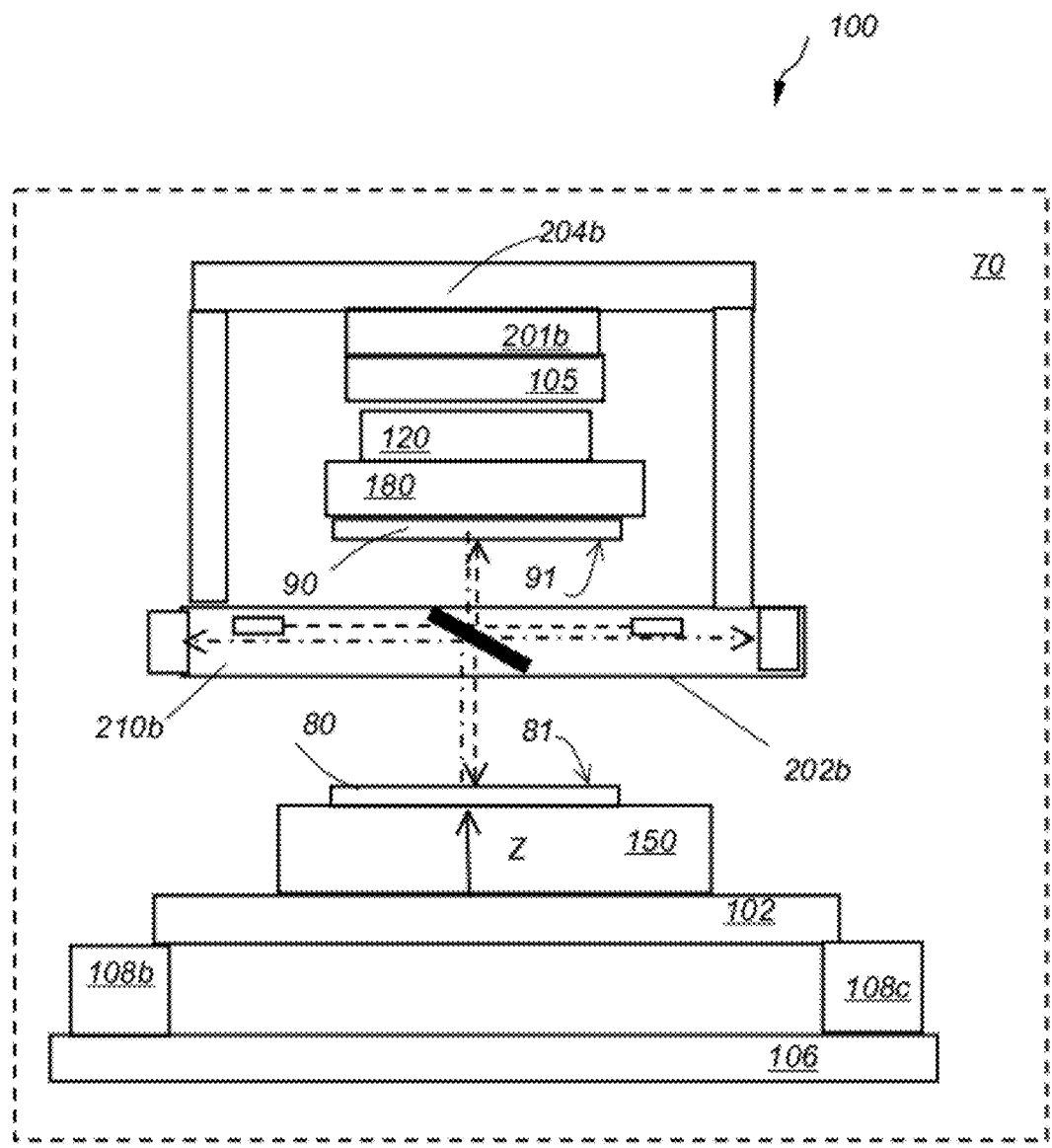
FIG. 3 is a schematic side view of the aligner system of FIG. 1.
Figure 4:
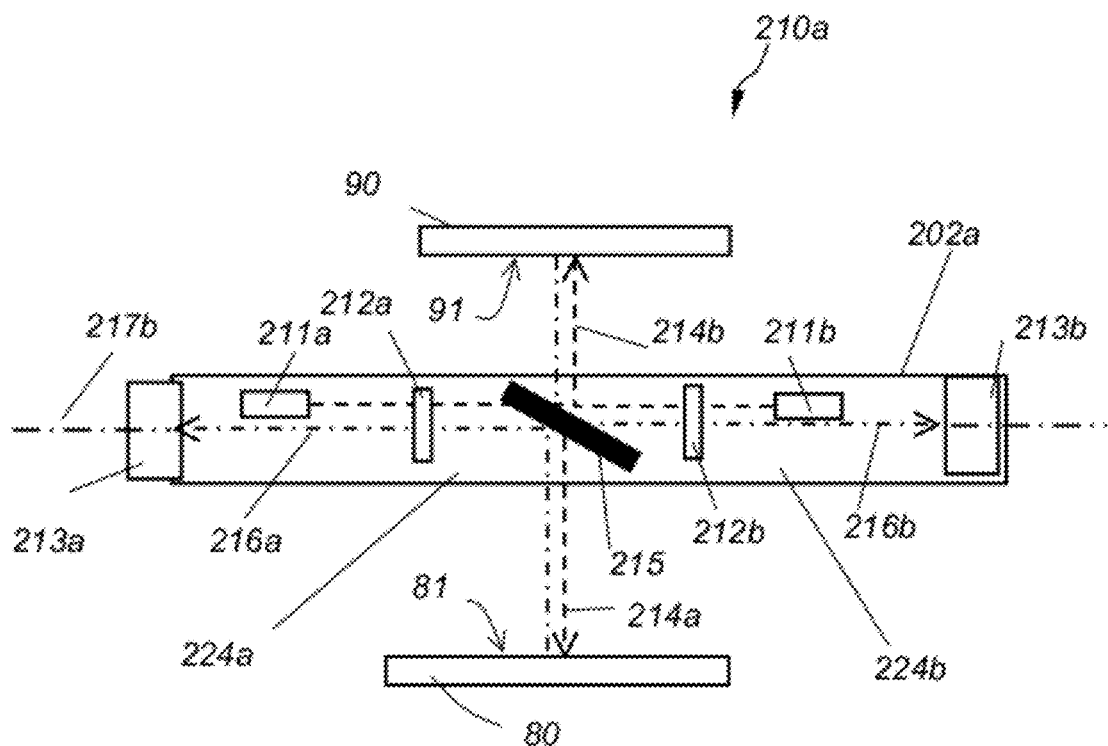
FIG. 4 is a schematic diagram of the microscope system of FIG. 1.
Figure 5:
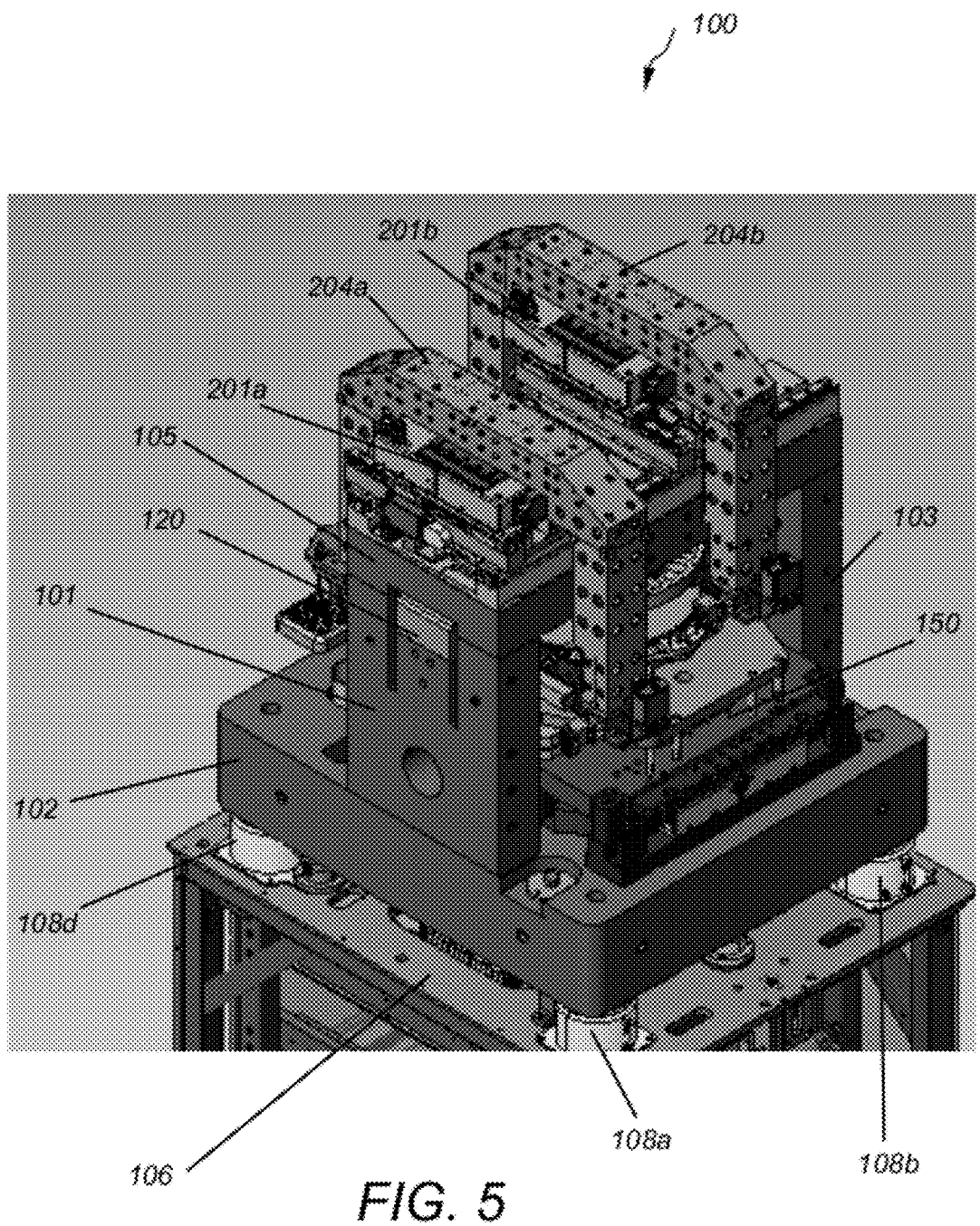
FIG. 5 is a perspective view of the aligner apparatus according tot his invention.

Referring to FIGS. 3 and 4, each microscope set 210a, 210b, includes two coaxially arranged microscopes 224a, 224b and 225a, 225b, placed within elongated tubes 202a, 202b, respectively. Each microscope 224a, 224b includes a light source 211a, 211b, a high performance objective lens 212a, 212b and a CCD camera 213a, 213b. A double-sided mirror 215 arranged at 45 degrees angle relative to the optical axis 217 is also included. Light 214a emitted from light source 211a is focused via the objective lens 212a and directed via the mirror 215 toward the lower wafer surface 81. Light 216a reflected by the lower wafer surface 81 is then directed by the mirror 215 and focused onto the CCD camera 213a. Similarly, light 214b emitted from light source 211b is focused via the objective lens 212b and directed via the mirror 215 toward the upper wafer surface 91. Light 216b reflected by the upper wafer surface 91 is then directed by the mirror 215 and focused onto the CCD camera 213b. The surface images of the lower and upper wafer surfaces 81, 91 collected by the CCD cameras 213a, 213b are then used to align the wafer surfaces 81, 91 parallel to each other. In one example, light sources 211a, 211b are yellow Light Emitting Diodes (LED). In other examples, other visible or infrared light sources are used.

Figure 8:
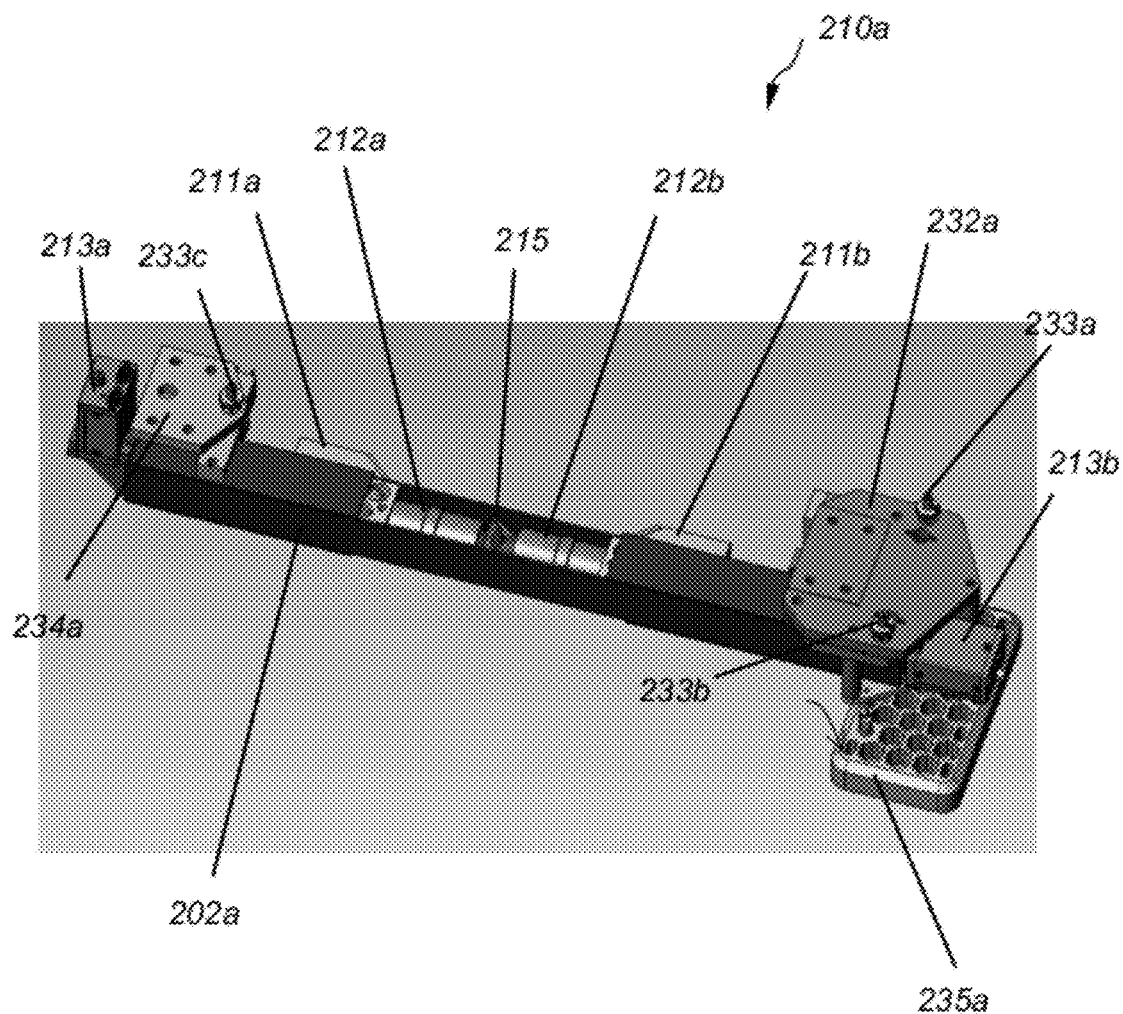
FIG. 8 is a perspective top view of the microscope system of FIG. 3.
Figure 9:
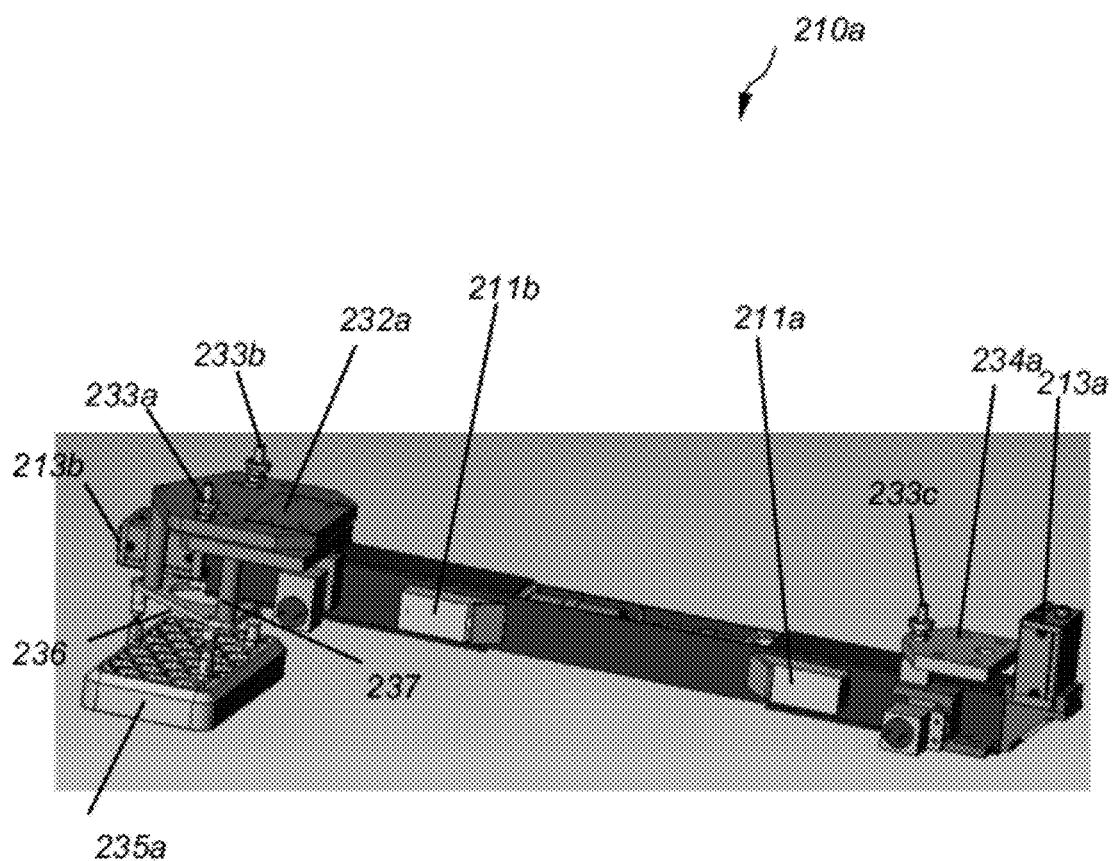
FIG. 9 is a perspective side view of the microscope system of FIG. 8.
Figure 10:
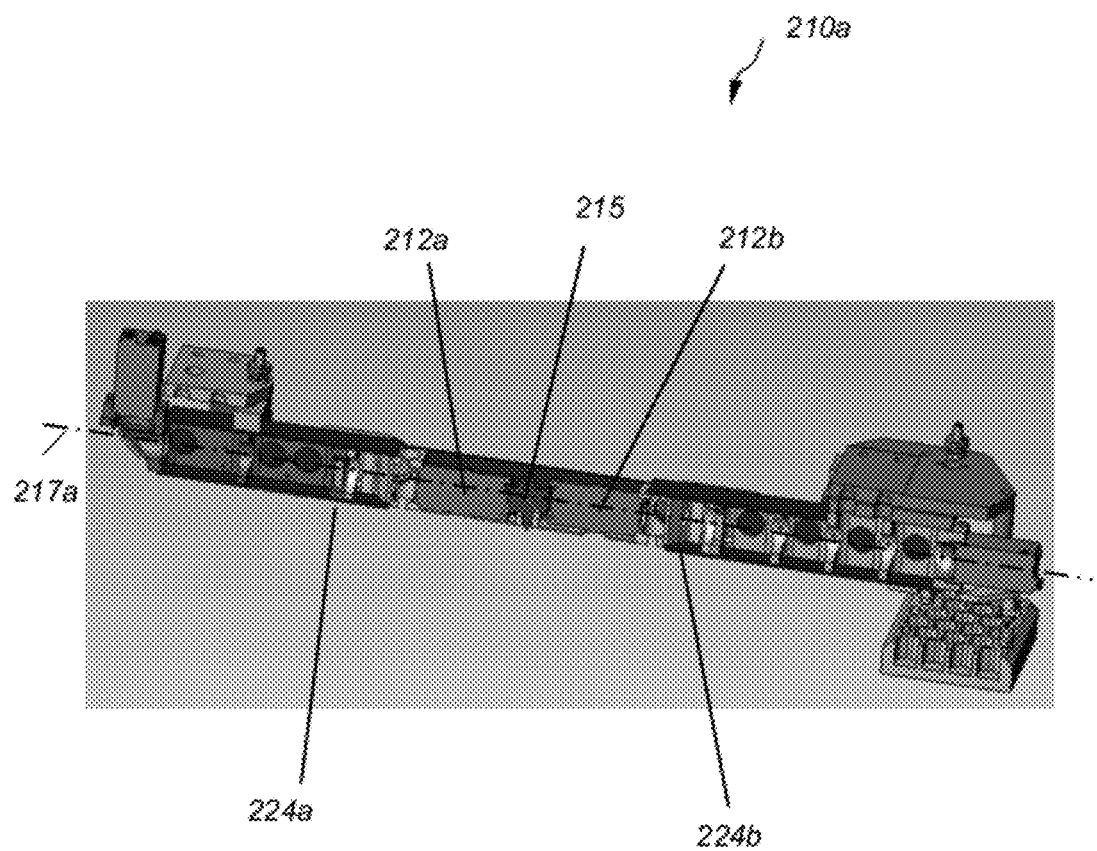
FIG. 10 is a cross-sectional side view of the microscope system of FIG. 8.
Figure 11:
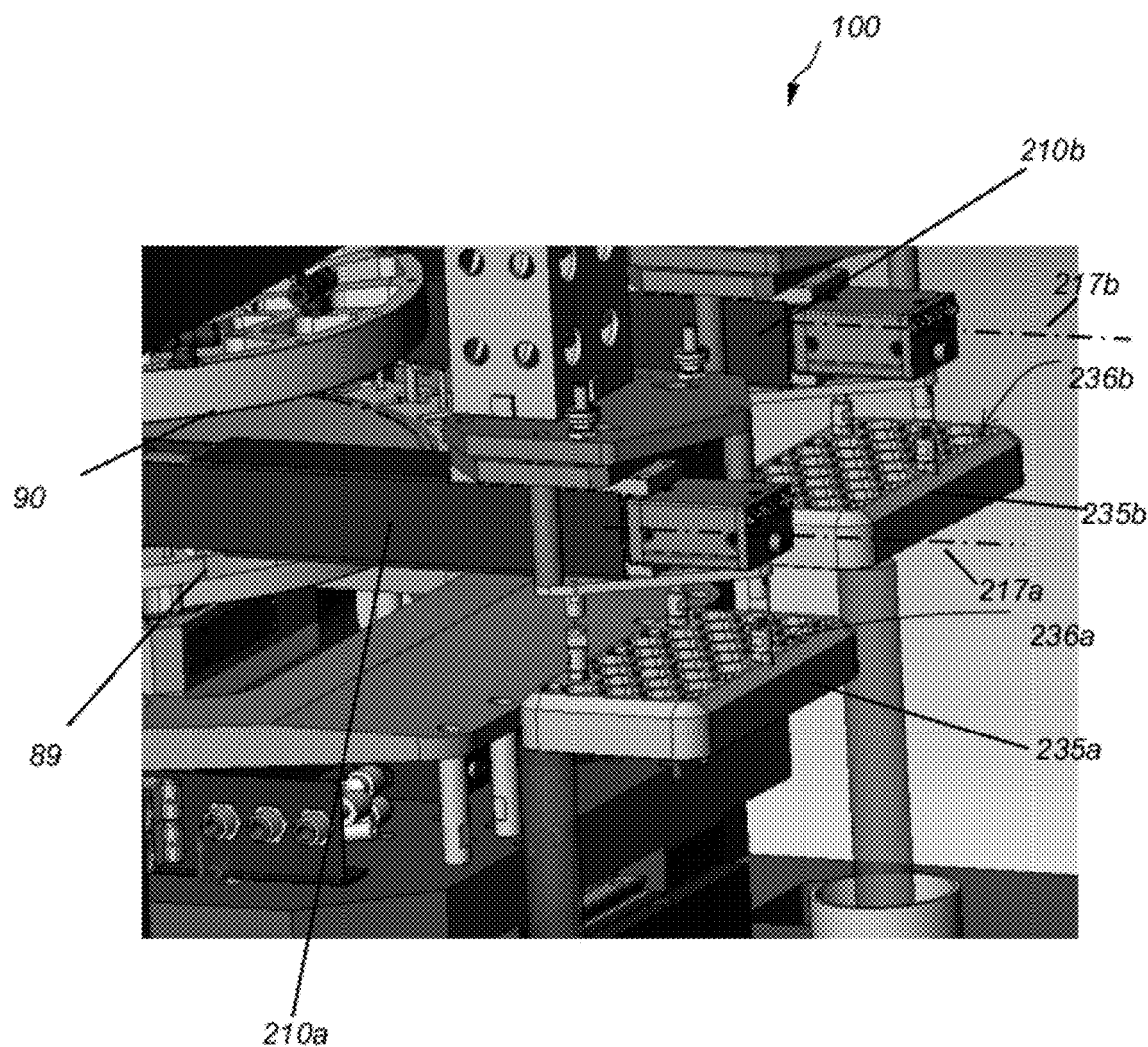
FIG. 11 is detailed view of the two microscope systems within the aligner of FIG. 8.

Elongated tubes 202a, 202b are connected to inverted U-shape structures 204a, 204b that are carried by the microscope XYZ stages 201a, 201b, respectively, around the frame beam 105. Microscope stages 201a, 201b move the axes 217a, 217b of the microscopes in X, Y, Z directions. In some embodiments stages 201a, 201b are X-Y-Z-T stages and may also rotate the microscope axes around an axis perpendicular to them by an angle theta (T). The legs of the U-shape structures 204a, 204b are fixedly connected to plates 232a, 232b, 234a, 234b and plates 232a, 232b, 234a, 234b are connected to the ends of the elongated tubes 202a, 202b, via three kinematic couplings 233a, 233b, 233c, as shown in FIG. 8. Mirrors 235a, 235b, are also connected to plates 232a, 232b, respectively, separately from the elongated tubes, and are arranged below the elongated tubes 202a, 202b, so that the microscope axes 217a, 217b are parallel to the mirror planes 236a, 236b, respectively, shown in FIG. 11. Furthermore, the apparatus includes left and right microscope calibration reference units 140a, 140b attached on the left and right frame legs 101, 103, respectively, shown in FIG. 1 and FIG. 7. Each reference unit 140a, 140b, includes fixed top and bottom reference marks K, K', L, L' located on fixed top and bottom plates 141a, 141b, 142a, 142b, respectively. The X-Y-Z and T coordinates of the two microscope optical axes 217a, 217b, and the angular position of the mirror planes 236a, 236b, shown in FIG. 11, are determined in reference to these fixed marks and are used as references for the wafer alignment process, as will be described below.

Referring to FIG. 7, upper wafer 90 is held via vacuum suction onto upper wafer block 180, so that surface 91 to be aligned parallel to the lower wafer surface 81 is facing down. Upper wafer block 180 includes an upper wafer plate 182 supporting the wafer 90 and a plate leveling system 184 for leveling upper wafer plate 182. The plate leveling system includes a spherical Wedge Error Compensating (WEC) mechanism that rotates and/or tilts the upper wafer plate 182 around a center point corresponding to the center of the wafer 90 without translation. Lower wafer 80 is held via vacuum suction onto lower wafer block 150, so that its surface 81 to be aligned parallel to the upper wafer surface 91 is facing up. Lower wafer block 150 includes a coarse X-Y-T air-bearing table 152 carrying an air bearing Z-stage 154, and a fine X-Y-T stage 155 is carried on top of the Z-stage. Fine X-Y-T stage 155 carries the lower wafer plate 156 upon which a fixture 300 carrying wafer 80 is positioned. In one example, coarse X-Y-T table 152 has a position range of ±3 millimeters and ±3 degrees, while fine X-Y-T stage has a position range of ±100 micrometers and ±1 millidegree and the Z-axis range is 60 millimeters. Connected to the coarse X-Y-T stage 152 are three position sensors 157 that measure the X-Y-T-distance between the coarse stage 152 and fine stage 155 and provide feedback for the fine X-Y-T manipulation of the lower wafer surface plane 81. In one example, the position sensors 157 are capacitance gauges and are used for making high precision non-contact measurements of linear displacements. Upper and lower wafer plates 182, 156, are made of materials with CTE matching the CTE of the wafers. In one example, wafers 80, 90 are made of silicon and plates 182, 156 are made of silicon carbide. In other embodiments, separate sets of position sensors are placed on both the lower wafer plate and the upper wafer plate.

Figure 12:
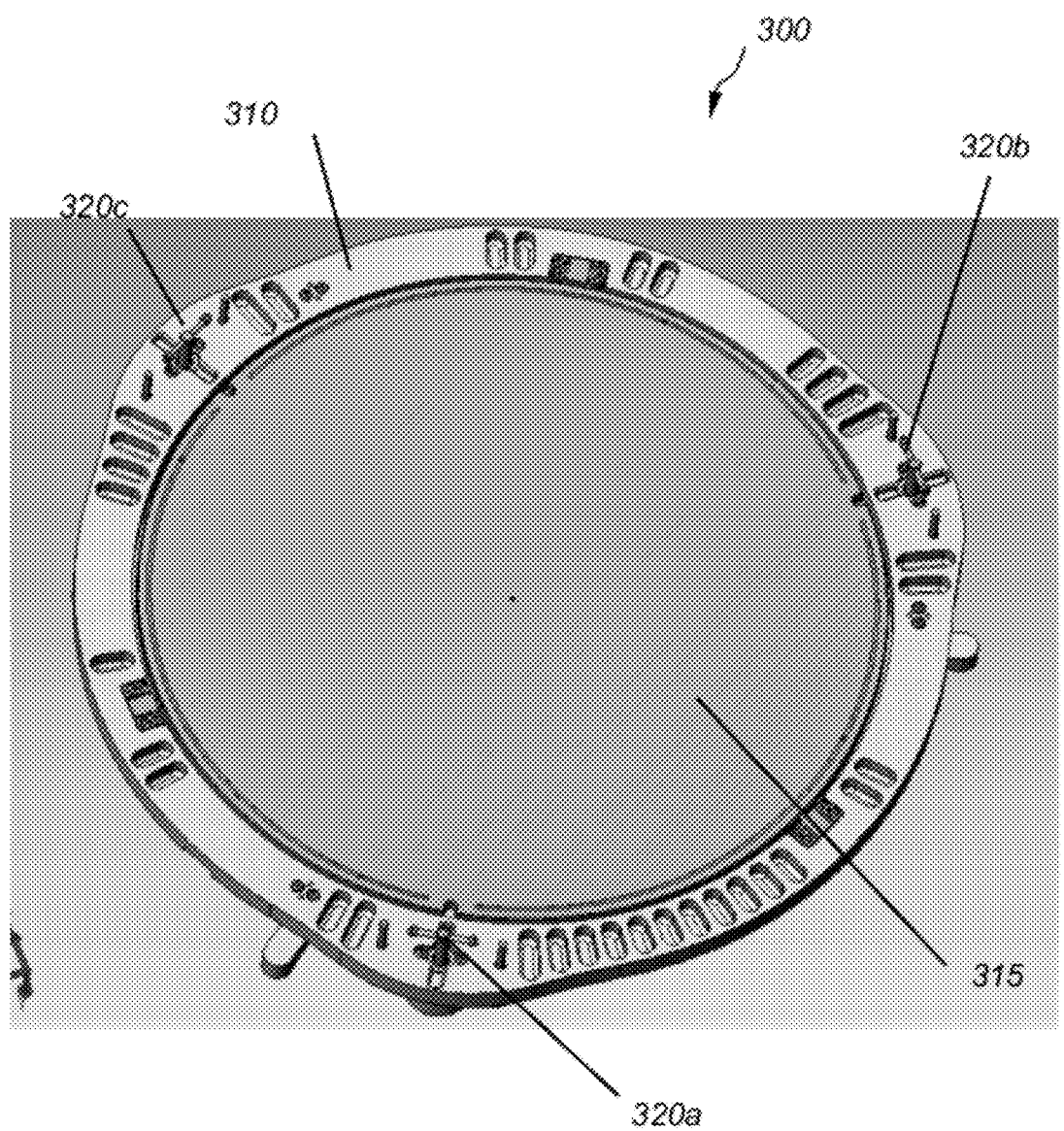
FIG. 12 is a top view of the wafer fixture tool.
Figure 13:
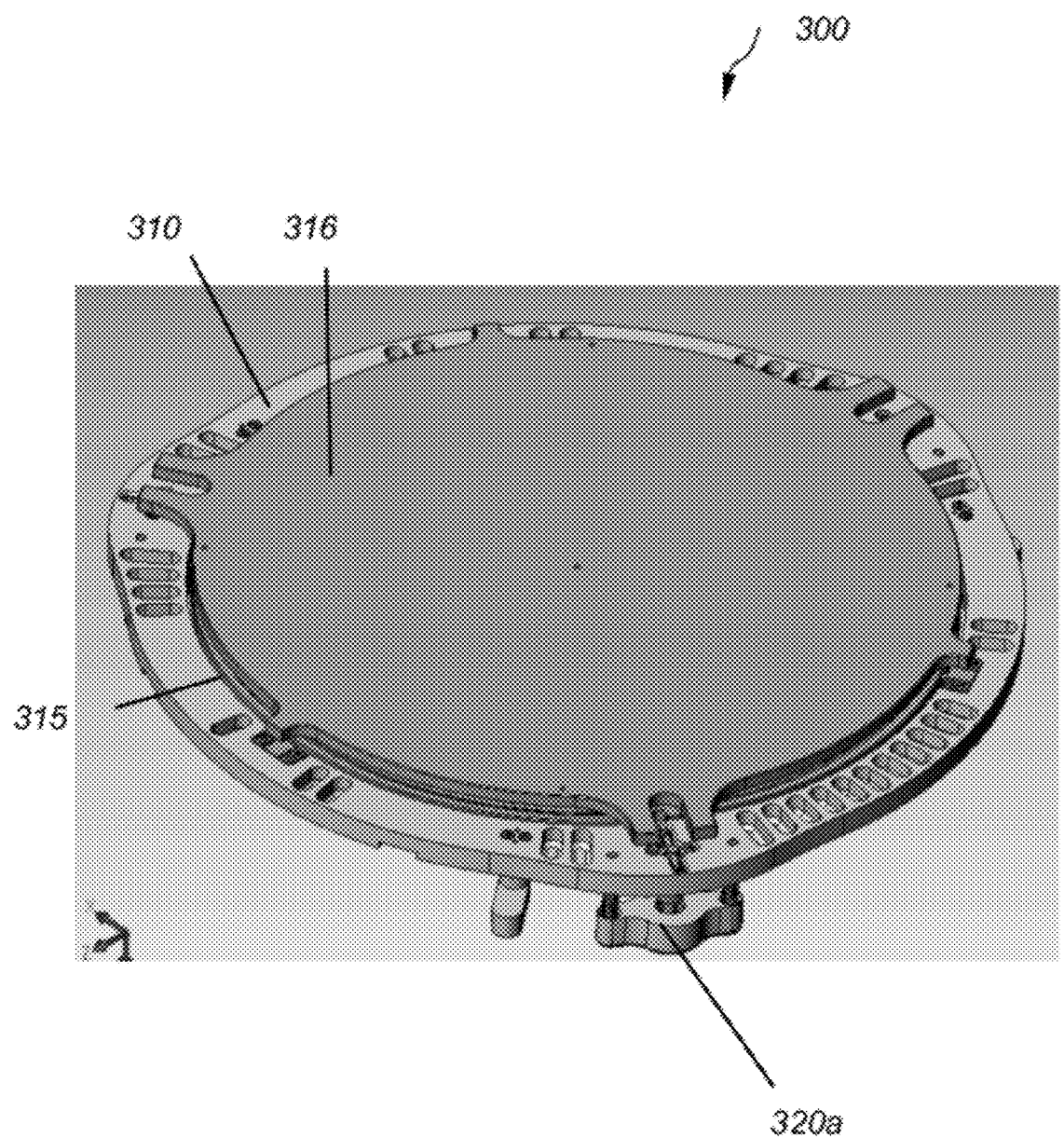
FIG. 13 is a top view of the wafer fixture tool loaded with the top and lower plates.
Figure 14:
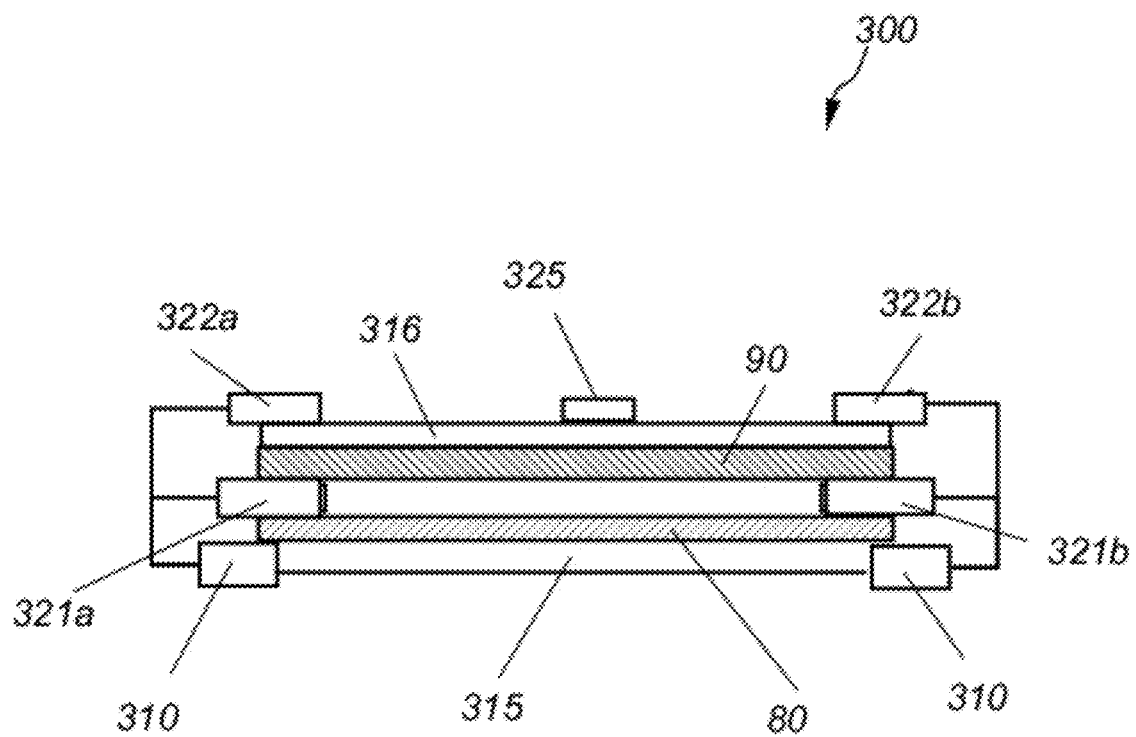
FIG. 14 is a schematic cross-sectional view of the wafer fixture tool loaded with the top and lower plates and wafers in the clamped position.
Figure 15:
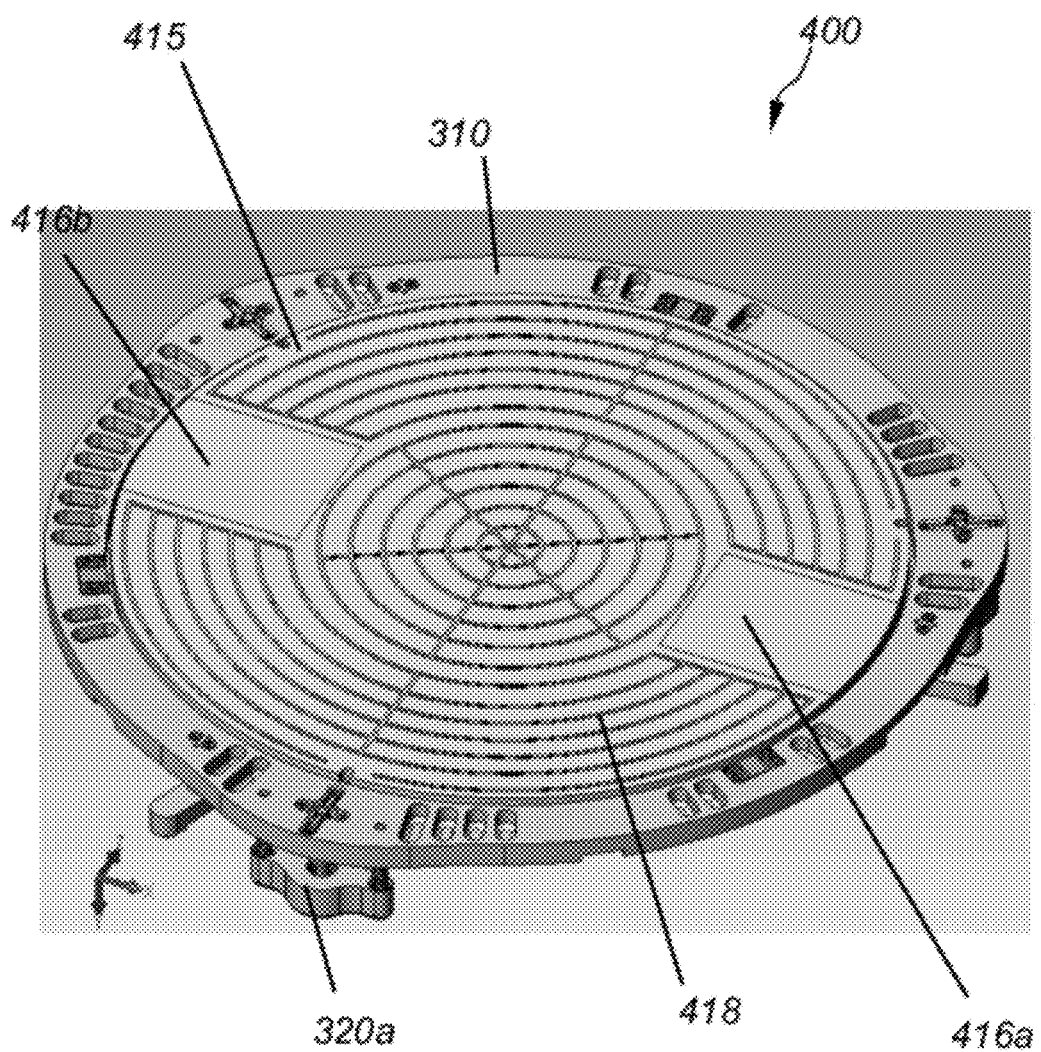
FIG. 15 is a top view of the lower plate of the global calibration device.
Figure 16:
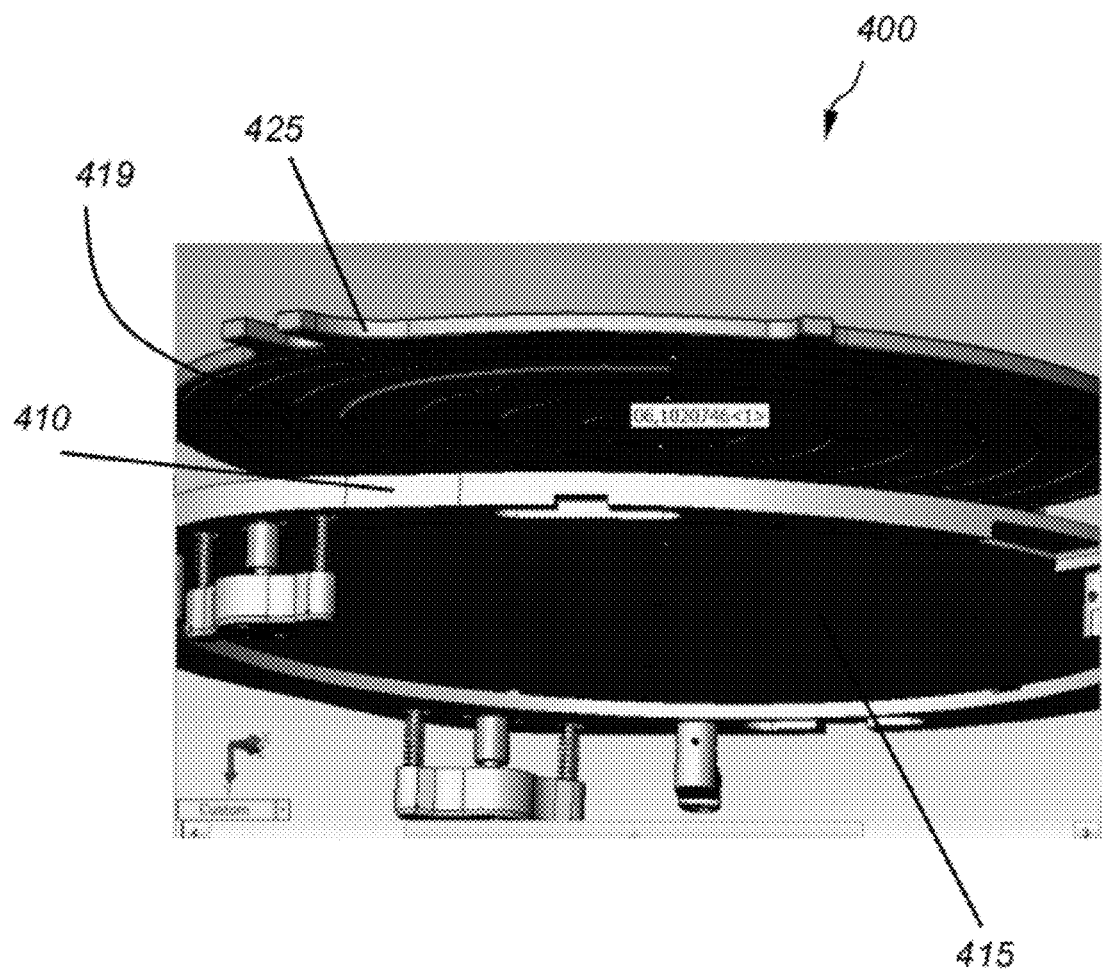
FIG. 16 is a side view of the top and lower plates of the global calibration device.
Figure 17:
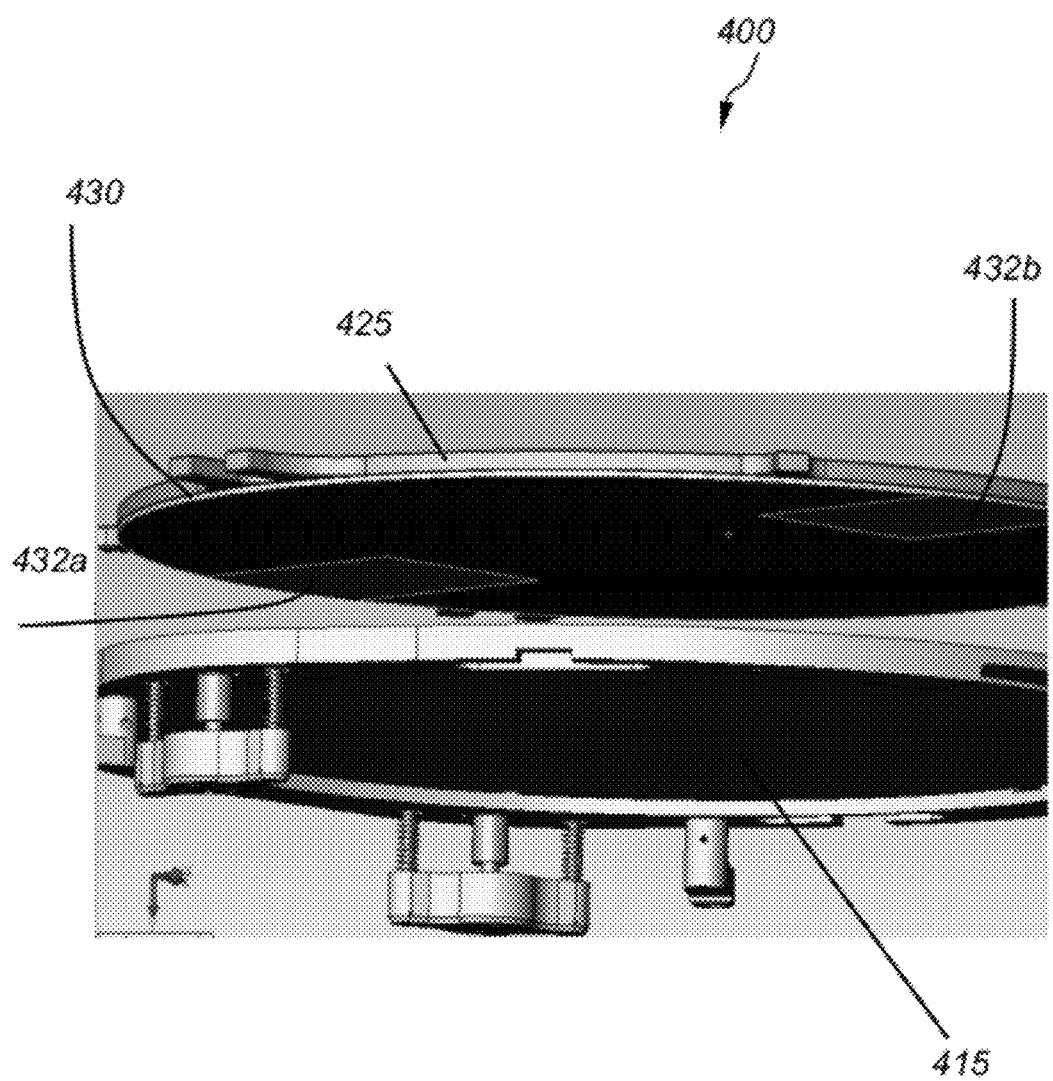
FIG. 17 is a side view of the top and lower plates and transparent wafer of the global calibration device.

Referring to FIG. 12, a fixture 300 is used to transport the upper and lower wafers 90, 80 in and out of the alignment apparatus and to maintain the alignment of the two wafers for further processing, such as bonding of the wafers or further deposition steps. Fixture 300 includes an outer ring 310 supporting a lower wafer carrier chuck 315 and three clamp/spacer assemblies 320a, 320b, 320c, arranged at the periphery of ring 310. Each clamp/spacer assembly 320a includes a spacer 321a and a clamp 322a. The motion of clamp/spacer assemblies is very precise and repeatable both at room temperatures and at the high temperatures where the further wafer processing takes place. Wafer 80 is placed on top of lower wafer carrier chuck 315, the spacers 321a, 321b, 321c are inserted on top of the edges of the wafer surface 81, then the upper wafer 90 is placed on top of the spacers 321a, 321b, 321c, and then the upper wafer carrier chuck 316 is placed on top of the upper wafer 90 and the clamps 322a, 322b, 322c engage the upper wafer carrier chuck to clamp the two wafers together onto the fixture. The spacers 321a, 321b, 321c, may be moved independent from each other from the clamping motion to bring the wafer surfaces 91, 81 in contact or to set a gap between them. The two clamped wafers may also be pinned together via a center pin 325, as shown in FIG. 14. In one example ring 310 is made of titanium and wafer carrier chucks 315, 316 are made of silicon carbide.

Referring to FIG. 18A-FIG. 20C, the alignment process includes the following steps. First, microscope sets 210a, 210b are positioned in the reference units 140a, 140b and microscopes 224a, 224b and 225a, 225b are focused onto the fixed top and bottom reference marks K, K', L, L' located on the top and bottom plates 141a, 141b, 142a, 142b, respectively. Next, a pattern recognition software is used to determine the X-Y coordinates of the fixed reference marks K, K', L, L' and their separation distance, as well as the angular positions theta (T) of the mirror planes 236a, 236b (reflecting the positions of microscope axes 217a, 217b) relative to the reference marks. Reference marks K, L and axis 217a define a reference plane 290a (shown in FIG. 20A) for microscopes 224a, 224b and marks K', L' and axis 217b define a reference plane 290b (not shown) for microscopes 225a, 225b. Next, the microscope sets 210a, 210b are inserted between the lower wafer 80 and upper wafer 90 and the X-Y-Z microscope stages 201a, 201b, are moved so that the images A', B' of the fiducial marks A, B, on the upper wafer surface 91 are brought into the field of view (FOV) 280 of the microscopes 224b, 225b looking up and the microscopes 224b, 225b are focused onto them, respectively, as shown in FIG. 19A. The microscope stages 201a, 201b are locked and then the lower wafer 80 is moved in the X-Y-T- and Z directions to bring the images C', D' of the lower wafer fiducial marks C, D, into the field of view 282 of the microscopes 224a, 224b looking down and to focus the microscopes 224a, 225a onto them, respectively, as shown in FIG. 19B. Next, the positions of the fiducial marks A, B, C, D are determined by analyzing their images A', B', C', D' within the corresponding fields of view 280, 282 of microscopes 224b, 225b, 224a, 225a with the pattern recognition software Patmax® program available from Cognex Co, Natick Mass., and by taking into consideration the positions of the microscopes 224b, 225b, 224a, 225a relative to the reference planes 290a, 290b. In addition to the microscope positions any change in the mirror angles (and the upon them reflected optical axes 217a, 217b) is taken into consideration and the X-Y-T offsets Δx, Δy, Δθ, shown in FIG. 20B, between the upper fiducial marks A, B and lower fiducial marks C, D are determined. Next, the lower wafer 80 (and carrier) is moved in the X-Y-T directions by the determined amount of the X-Y-T offsets Δx, Δy, Δθ, to position the fiducial marks C, D of the lower wafer 80 in alignment with the fiducial marks A, B of the upper wafer 90, shown in FIG. 19C and FIG. 20C. This results with the lower wafer 80 being in alignment with the upper wafer 90 while they are separated by a distance 294. Next, the lower wafer 80 is moved up in the Z-direction while the X-Y-T position of wafer stage 155 is maintained by measuring its distance from the coarse stage 152 with the three co-planar position sensor 157 that are fixed on it and adjusting the position of wafer stage 155 so that the aligned lower wafer 80 position is maintained. The lower wafer 80 is moved up in the Z-direction until surface 81 contacts the surface 91 of the upper wafer 90. The aligned stack of wafers 80, 90 is clamped with clamps 322a, 322b, 322c onto the fixture 300 and is removed from the aligner for further processing, such as bonding of the two wafers. In other embodiments, wafer 80 is moved up in the Z-direction until surface 81 contacts spacers 321a, 321b, 321c inserted between the two wafers. In this configuration wafers 80 and 90 are clamped together while separated by a distance corresponding to the spacer thickness.

Figure 18A:
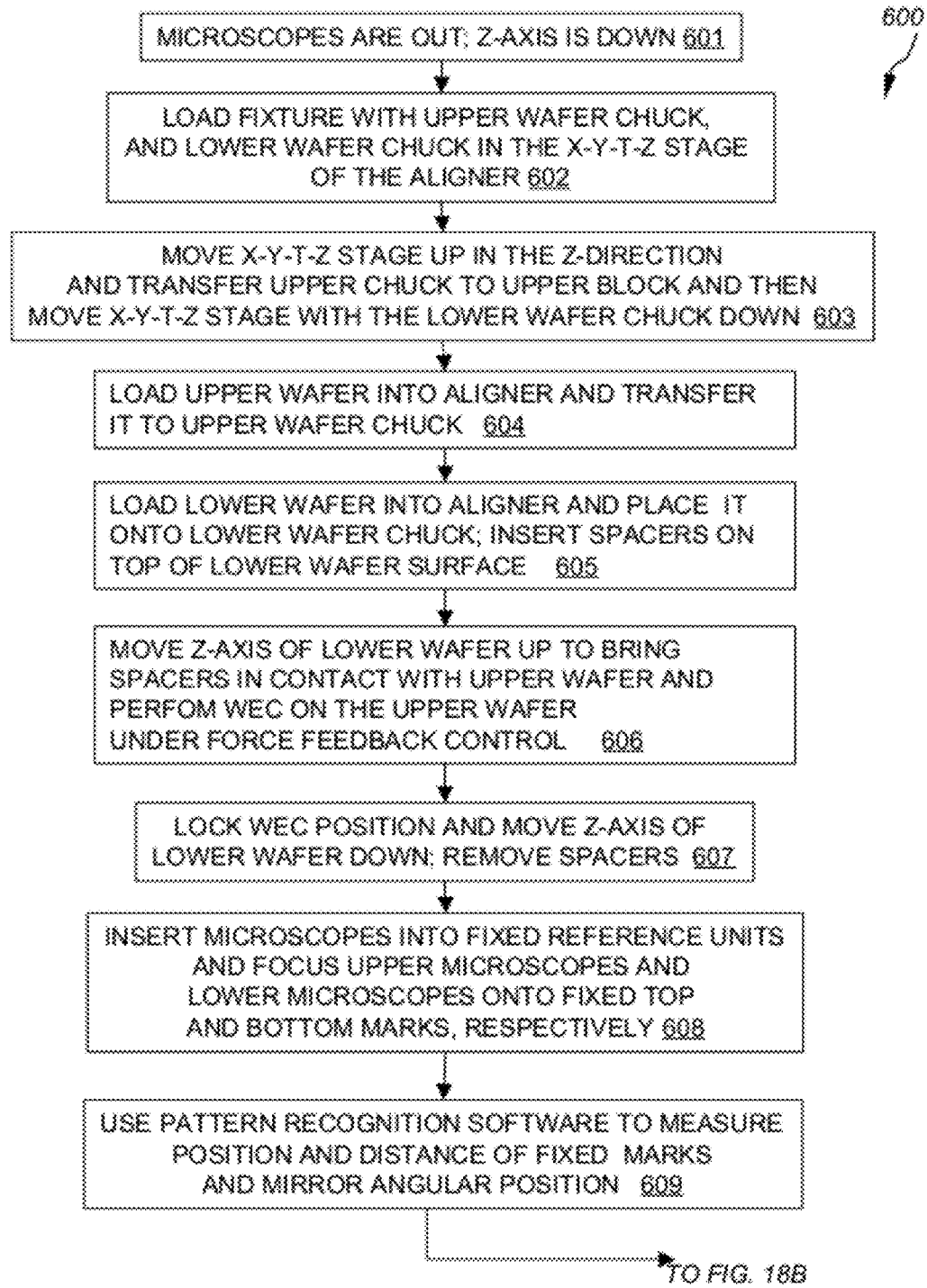
FIG. 18A-FIG. 18B is a flow diagram of the alignment process.
Figure 18B:
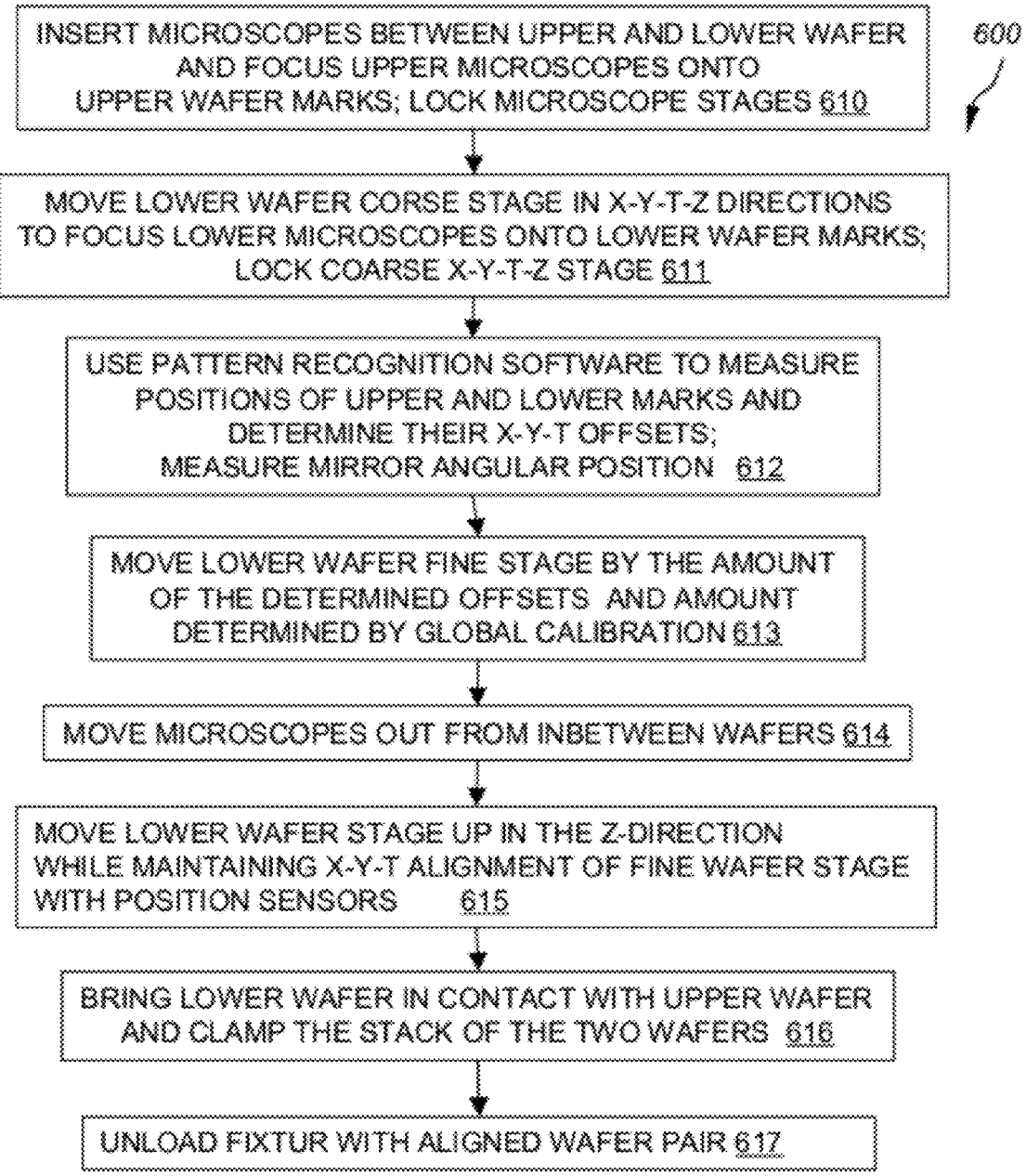
Figure 19A:
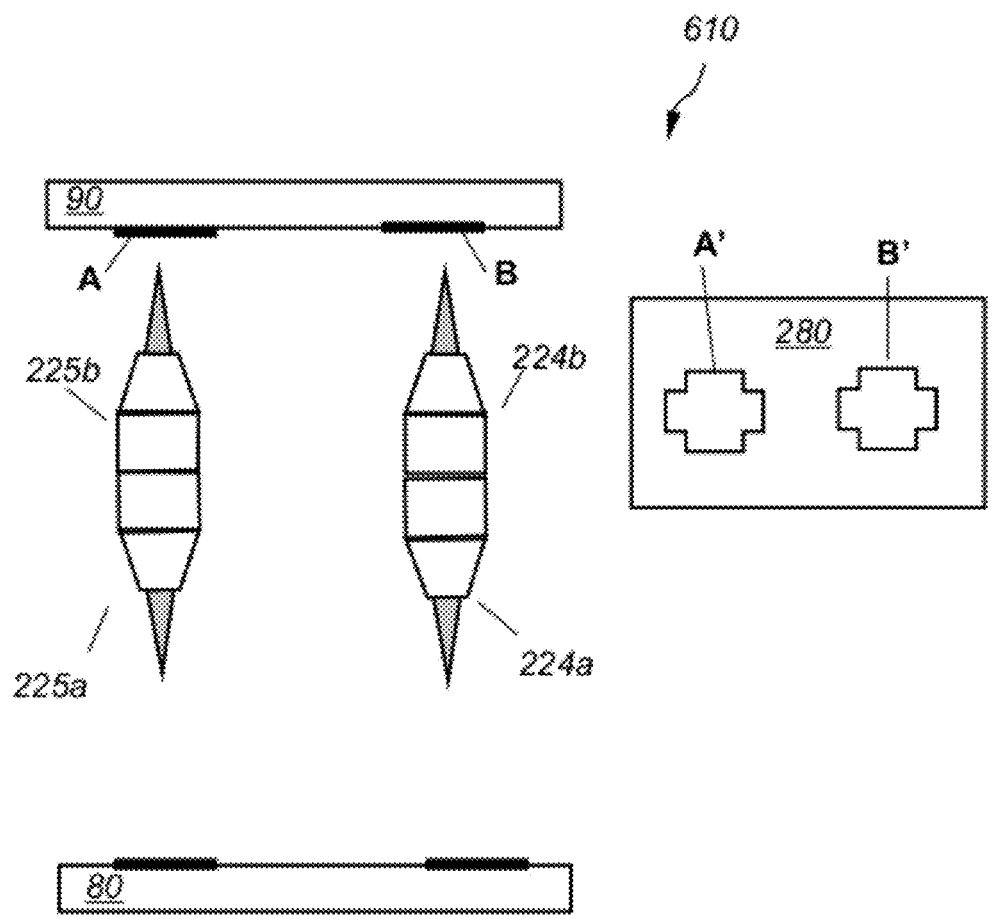
FIG. 19A is a schematic diagram of step 610 of the alignment process of FIG. 18B.
Figure 19B:
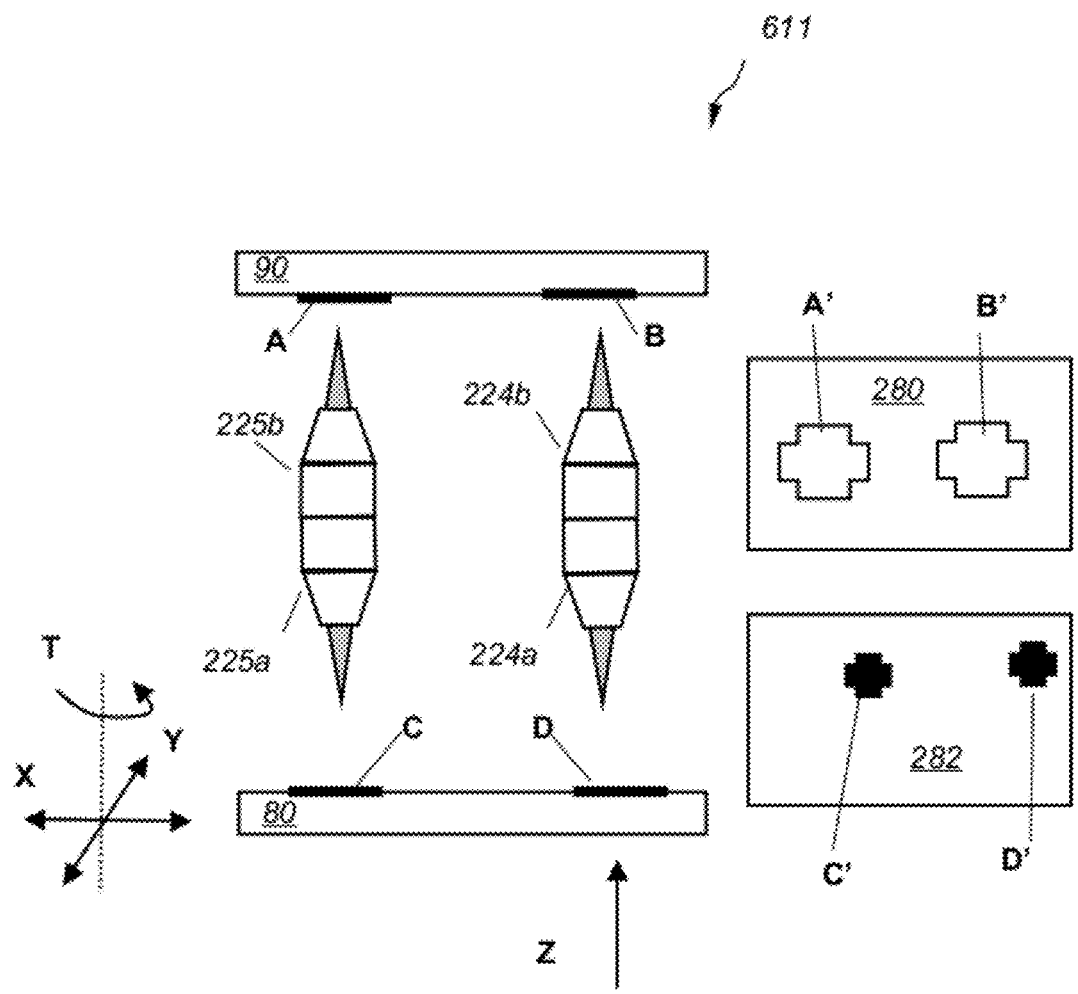
FIG. 19B is a schematic diagram of step 611 of the alignment process of FIG. 18B.
Figure 19C:
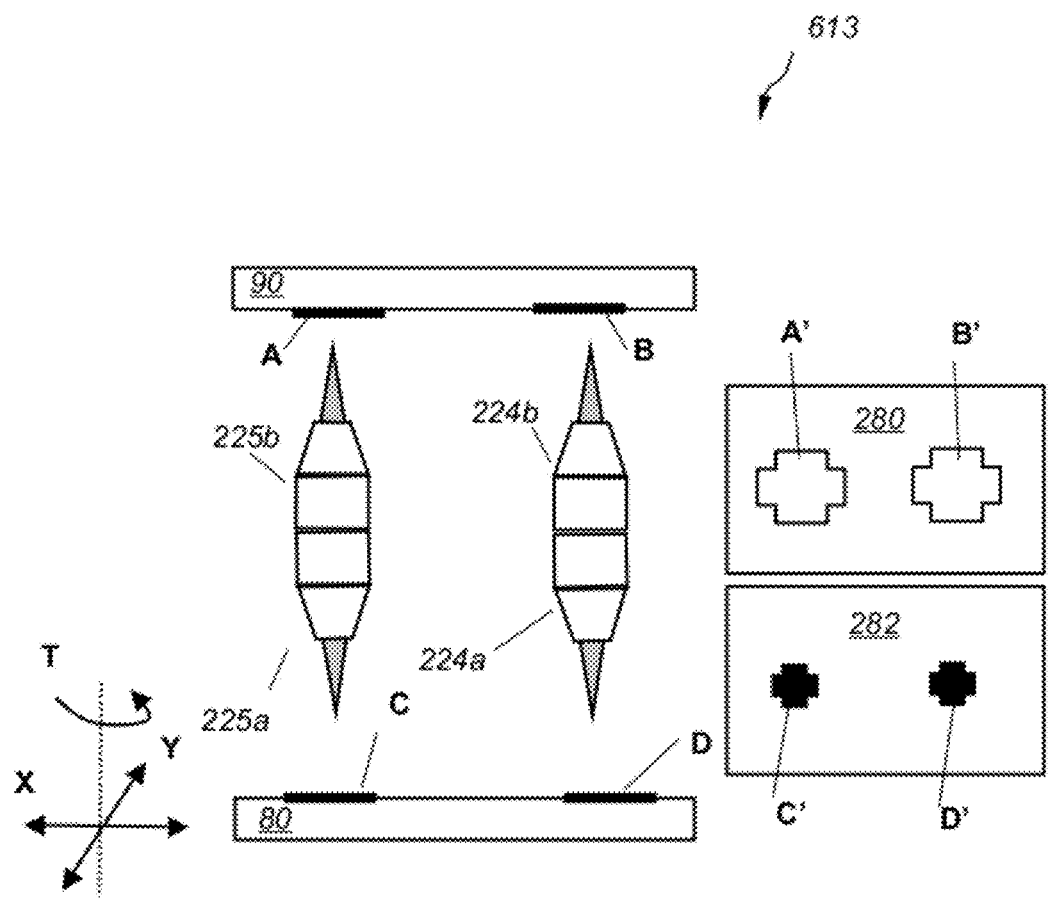
FIG. 19C is a schematic diagram of step 613 of the alignment process of FIG. 18B.
Figure 20A:
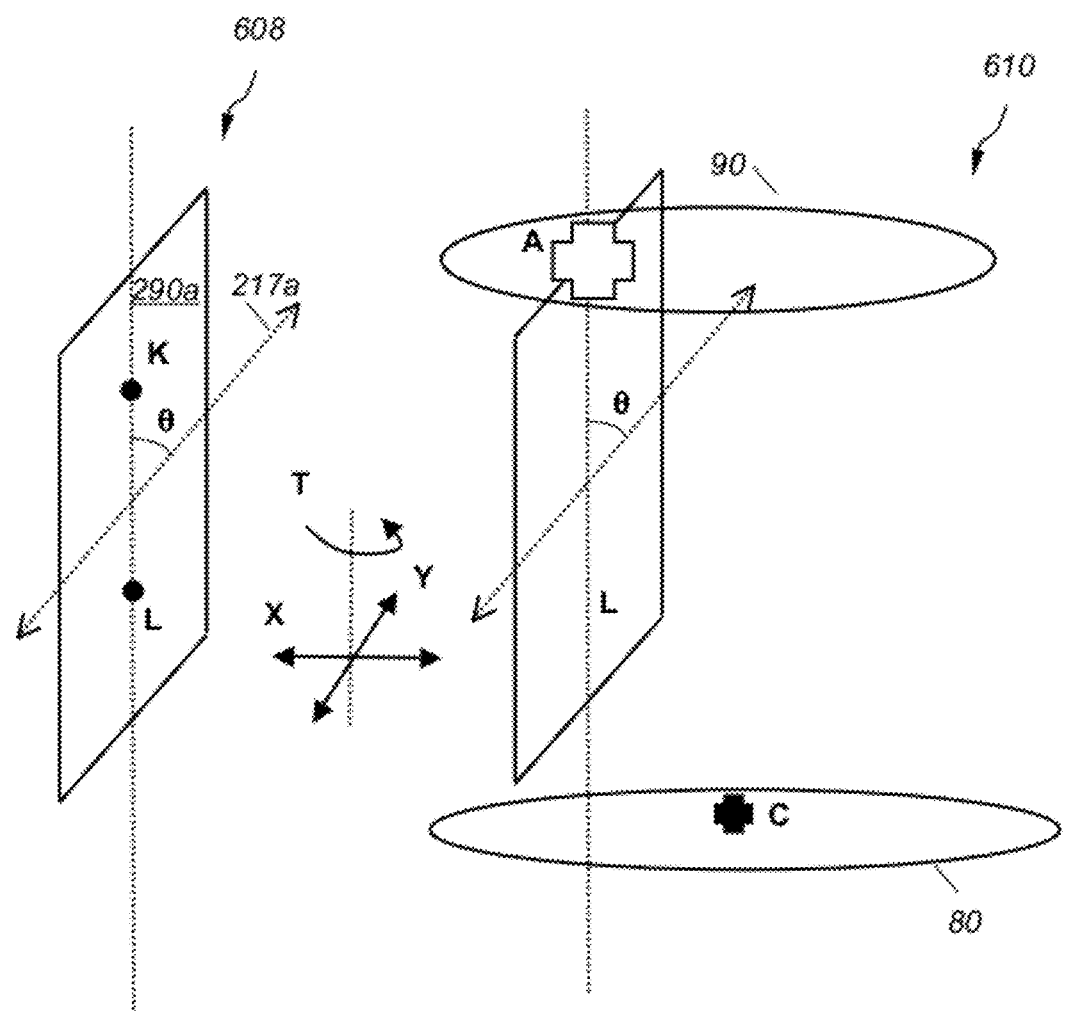
FIG. 20A is a schematic diagram of steps, 608 and 611 of the alignment process of FIG. 18A-FIG. 18B.
Figure 20B:
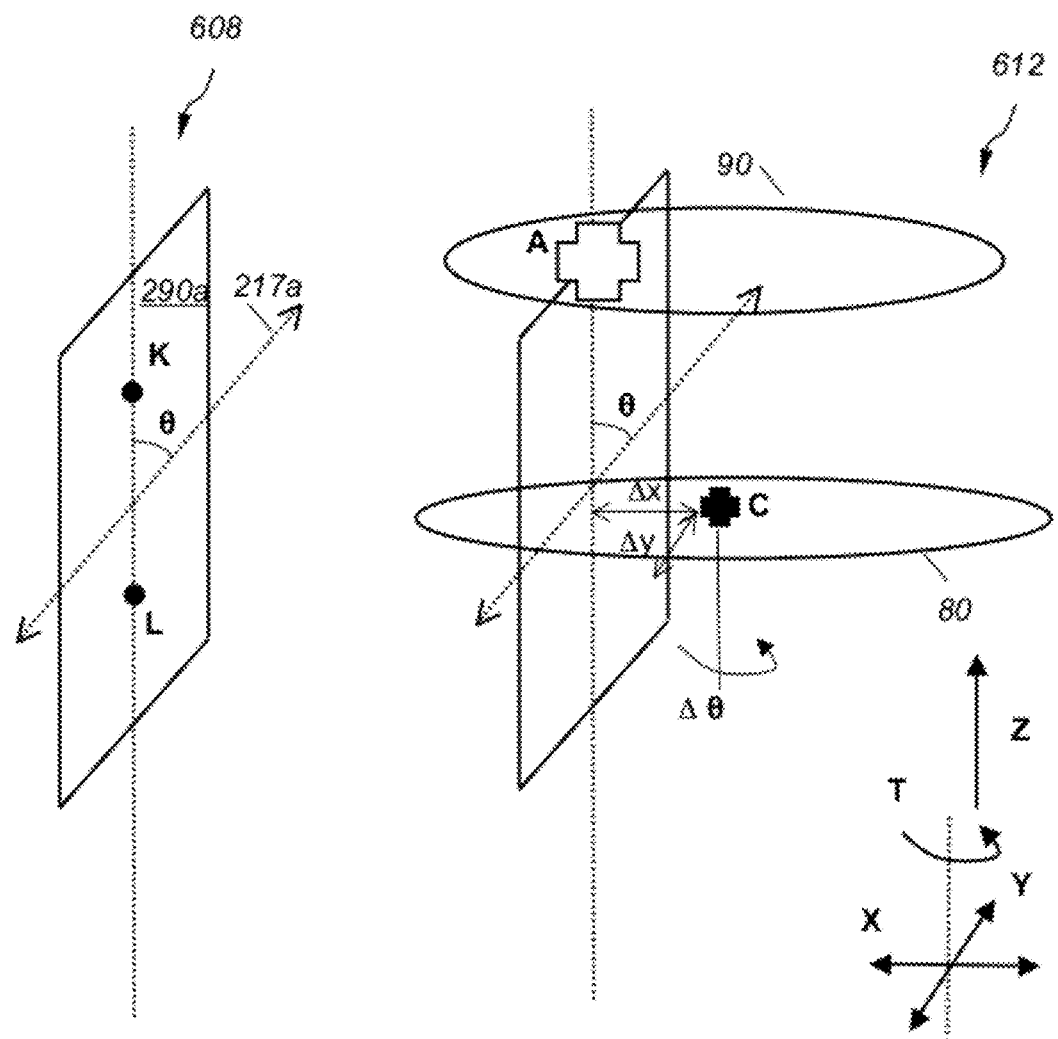
FIG. 20B is a schematic diagram of steps, 608 and 612 of the alignment process of FIG. 18A-FIG. 18B.
Figure 20C:
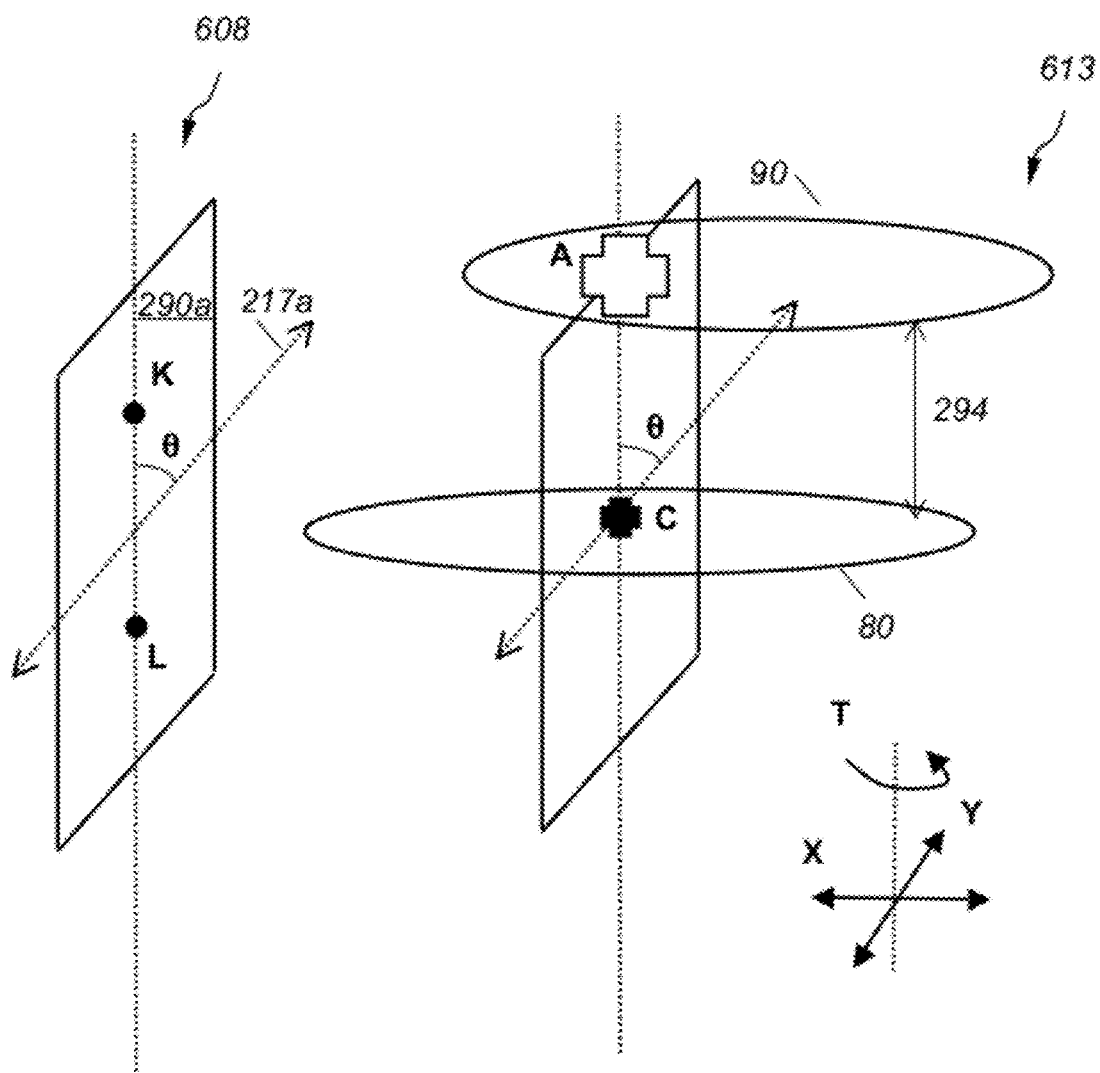
FIG. 20C is a schematic diagram of steps, 608 and 613 of the alignment process of FIG. 18A-FIG. 18B.

The complete alignment sequence 600 is depicted in FIG. 18A-FIG. 18B and includes the following steps. Starting out, the microscopes are out of the space between the upper and lower blocks 180, 150 and the Z-axis of the X-Y-T-Z wafer stage 152 is down (601). Next, the fixture 300 with the upper and lower wafer chucks is loaded in the aligner and placed on the X-Y-T-Z wafer stage 152 (602). X-Y-T-Z wafer stage 152 is then moved up in the Z-direction and the upper chuck is handed over to the upper block 180. X-Y-T-Z wafer stage 152 with the lower wafer chuck is then moved down (603). Next, the upper wafer 90 is loaded in the aligner and transferred to the upper wafer chuck (604). The lower wafer is then loaded into the aligner and transferred onto the lower wafer chuck and the spacers are placed on top of the lower wafer surface (605). The z-axis of the lower wafer stage 152 is then moved up to bring the spacers in contact with the upper wafer 90 and to perform the Wedge Error Correction (WEC) on the upper wafer plate under force feedback control (606). The upper wafer plate position is locked and the z-axis is moved down and the spacers are removed (607). Next the microscopes are inserted in the fixed reference units and the upper microscopes are focused onto the fixed top marks and the lower microscopes are focused onto the fixed bottom marks (608). The fixed mark images are analyzed with an image pattern recognition software and their position, the distance from each other and the mirror angular positions (i.e., axes of the microscopes) are determined (609). These measurements define the reference point (i.e., center of coordinate system) for the further measurements. Next, the microscopes are inserted between the upper and lower wafer and the upper directed microscopes are focused onto the upper wafer marks. The microscope positions are then locked (610). The lower X-Y-T-Z wafer stage 152 is then moved to focus the lower directed microscopes onto the lower wafer marks and the stage position is locked (611). The images of the upper and lower marks are analyzed with the image pattern recognition software and their position relative to the fixed mark positions and the X-Y-T offsets between them are determined and the mirror angular positions (i.e., axes of the microscopes) are also measured (612). The lower wafer fine stage is then moved by the X-Y-T offset amount and by the amount determined by the global calibration, as is described below (613). Next, the microscopes are moved out of the space between the upper and lower wafer (614) and the lower wafer stage is moved up in the z-direction while the X-Y-T alignment of the fine wafer stage is maintained with the help of the position sensors (615). The lower wafer 80 is brought into contact with the upper wafer 90 and the stack is clamped together (616) in the fixture 300. Finally, the aligned wafer set and fixture are removed from the aligner and placed into another process chamber (617) for further processing such as bonding or deposition.

The aligner system 100 is calibrated with a global calibration device 400 shown in FIG. 14-FIG. 17. Global calibration device 400 includes a lower plate 415, an upper plate 425 and a clear transparent wafer 430 (shown in FIG. 17) arranged between them. Lower plate 415 includes concentric vacuum grooves 418 and fiducial marks 416a, 416b. Upper plate 425 includes vacuum grooves 419 and transparent wafer 430 includes fiducial marks 432a, 432b. Lower plate 415, transparent wafer 430 and upper plate 425 are placed in fixture 300 and are placed in the aligner apparatus 100. The above described alignment process 600 is performed to bring the fiducial marks 432a, 432b of the transparent wafer 430 in alignment with the fiducial marks 416a, 416b of the lower plate 415. Next, the transparent wafer 430 is placed in contact with the lower plate and the overlap of the transparent wafer marks 432a, 432b with the lower plate marks 416a, 416b is observed with the down focusing microscopes 225a, 224a. Any X-Y-T offsets between these marks are measured, as well as the mirror angular positions and are used for the global calibration correction.

In some embodiments, the entire aligner 100 may be enclosed in a controlled atmosphere, temperature and pressure chamber 70, as shown in FIG. 1. The microscope stages 201a, 201b may be X-Y-Z-T stages.

Several embodiments of the present invention have been described. Nevertheless, it will be understood that various modifications is made without departing from the spirit and scope of the invention. Accordingly, other embodiments are within the scope of the following claims.

What is claimed is:

1. An apparatus for aligning semiconductor wafers comprising:
   equipment for positioning a first surface of a first semiconductor wafer directly opposite to a first surface of a second semiconductor wafer;
   equipment for aligning a first structure on said first semiconductor wafer with a second structure on said first surface of said second semiconductor wafer and wherein said aligning equipment comprises at least one movable alignment device configured to be moved during alignment and to be inserted between said first surface of said first semiconductor wafer and said first surface of said second semiconductor wafer, wherein said movable alignment device comprises an optical microscope assembly; and
   wherein said alignment equipment further comprises a microscope calibration reference unit.

2. The apparatus of claim 1 wherein said positioning equipment are vibrationally and mechanically isolated from said alignment equipment.

3. The apparatus of claim 2 further comprising an inverted U-shaped frame and a vibration isolated base and wherein said inverted U-shaped frame is supported on a top surface of said base.

4. The apparatus of claim 3 wherein said inverted U-shaped frame comprises:
   left and right vertical columns;
   a horizontal beam comprising left and right ends;
   wherein each of said column tops comprises two parallel vertical slots extending from said column top surface toward said column center and wherein said two vertical slots are separated by a center block and wherein said center block extends from the bottom of said slots toward said column top and has a height less than the height of said vertical slots thereby forming a gap between said two vertical slots near said column top surface; and
   wherein said left and right ends of said horizontal beam are supported upon said center blocks of said left and right vertical columns, respectively.

5. The apparatus of claim 4 further comprising a XYZ-stage supporting said movable alignment device and wherein said XYZ-stage is configured to slide along said horizontal beam and be supported by said horizontal beam.

6. The apparatus of claim 1 wherein said optical microscope assembly, comprises:
   an elongated tube;
   first and second optical microscopes arranged coaxially within said elongated tube along a first axis;
   wherein said first and second optical microscopes are configured to obtain first and second images of said first and second structures, respectively; and
   wherein said first and second images of said first and second structures are used to determine coordinates of said first and second structures relative to fixed top and bottom reference marks and to guide said positioning equipment for aligning said first surfaces of said first and second semiconductor wafers parallel to each other.

7. The apparatus of claim 6 wherein said calibration reference unit is attached to one of said vertical columns and comprises said fixed top and bottom reference marks.

8. The apparatus of claim 7 wherein said optical microscope assembly further comprises a mirror plane arranged so that said first axis is parallel to said mirror plane.

9. The apparatus of claim 8 further comprising a pattern recognition software used to analyze said first and second images of said first and second structures, respectively, and to determine their coordinates relative to said fixed top and bottom reference marks.

10. The apparatus of claim 9 wherein said positioning equipment comprises:
a lower support block comprising a lower wafer plate supporting said first semiconductor wafer; and
an upper supporting block comprising an upper wafer plate supporting said second semiconductor wafer and a plate leveling system for leveling said upper wafer plate.

11. The apparatus of claim 10 wherein said plate leveling system comprises a spherical wedge error compensation mechanism that rotates and/or tilts said upper wafer plate around a center point corresponding to the center of said second semiconductor wafer without translation.

12. The apparatus of claim 11 wherein said lower support block comprises a coarse X-Y-T stage, an air bearing Z-stage carried by said coarse X-Y-T stage and a fine X-Y-T stage carried on top of said Z-stage, and wherein said X-Y-T fine stage carries said lower wafer plate.

13. The apparatus of claim 12 wherein said X-Y-T coarse stage further comprises one or more position sensors for measuring the X-Y-T distance between said coarse X-Y-T stage and said fine X-Y-T stage.

14. The apparatus of claim 13 wherein said position sensors comprise capacitance gauges.

15. The apparatus of claim 14 wherein said upper and lower wafer plates comprise materials having a CTE matching the semiconductor wafer CTE.

16. The apparatus of claim 1 further comprising a fixture for transporting said first and second semiconductor wafers, said fixture comprising an outer ring supporting a lower wafer carrier chuck and three or more clamp/spacer assemblies arranged at the periphery of said outer ring.

17. The apparatus of claim 16 wherein each of said clamp/spacer assemblies comprise a clamp and a spacer and wherein said clamp and said spacer are configured to be moved independent from each other and from the motion of clamps or spacers of the other assemblies and wherein said motion is precise and repeatable both at room and high temperatures.

18. The apparatus of claim 17 wherein said fixture further comprises a center pin for pinning together the centers of said first and second semiconductor wafers.

19. The apparatus of claim 18 wherein said first semiconductor wafer is placed upon said lower wafer carrier chuck, said spacers are inserted on top of the edge of said first semiconductor wafer surface and then said second semiconductor wafer is placed on top of said spacers and then said first and second semiconductor wafers are clamped together via said clamps.

20. A method for aligning semiconductor wafers comprising:
positioning a first surface of a first semiconductor wafer directly opposite to a first surface of a second semiconductor wafer;
providing alignment equipment comprising at least one movable alignment device; and
aligning a first structure on said first semiconductor wafer with a second structure on said first surface of said second semiconductor wafer by inserting said movable alignment device between said first surface of said first semiconductor wafer and said first surface of said second semiconductor wafer;
wherein said movable alignment device comprises an optical microscope assembly and wherein said alignment equipment further comprises a microscope calibration reference unit.

21. The method of claim 20 wherein said positioning step is vibrationally and mechanically isolated from said inserting of said movable alignment device between said first surface of said first semiconductor wafer and said first surface of said second semiconductor wafer.

22. The method of claim 21 wherein said optical microscope assembly comprises:
an elongated tube;
first and second optical microscopes arranged coaxially within said elongated tube along a first axis;
wherein said first and second optical microscopes are configured to obtain first and second images of said first and second structures, respectively; and
wherein said first and second images of said first and second structures are used to determine coordinates of said first and second structure relative to fixed top and bottom reference marks and to guide said positioning equipment for aligning said first surfaces of said first and second semiconductor wafers parallel to each other.

23. The method of claim 22 wherein said calibration reference unit comprises said fixed top and bottom reference marks.

24. The method of claim 23 wherein said optical microscope assembly further comprises a mirror plane arranged so that said first axis is parallel to said mirror plane.

25. The method of claim 24 further comprising providing a pattern recognition software for analyzing said first and second images of said first and second structures, respectively, and determining their coordinates relative to said fixed top and bottom reference marks.

26. The method of claim 25 wherein said positioning step comprises:
providing a lower support block comprising a lower wafer plate and placing said first semiconductor wafer upon said lower wafer plate; and
providing an upper supporting block comprising an upper wafer plate for supporting said second semiconductor wafer and a plate leveling system for leveling said upper wafer plate.

27. The method of claim 26 wherein said plate leveling system comprises a spherical wedge error compensation mechanism that rotates and/or tilts said upper wafer plate around a center point corresponding to the center of said second semiconductor wafer without translation.

28. The method of claim 27 wherein said lower support block comprises a coarse X-Y-T stage, an air bearing Z-stage carried by said coarse X-Y-T stage and a fine X-Y-T stage carried on top of said Z-stage, and wherein said X-Y-T fine stage carries said lower wafer plate.

29. The method of claim 28 wherein said X-Y-T coarse stage further comprises one or more position sensors for measuring the X-Y-T-distance between said coarse X-Y-T stage and said fine X-Y-T stage.

30. The method of claim 28 further comprising providing a fixture for transporting said first and second semiconductor wafers, said fixture comprising an outer ring supporting a lower wafer carrier chuck and three or more clamp/spacer assemblies arranged at the periphery of said outer ring and an upper wafer carrier chuck.

31. The method of claim 30 wherein each of said clamp/spacer assemblies comprise a clamp and a spacer and wherein said clamp and said spacer are configured to be moved independent from each other and from the motion of clamps or spacers of the other assemblies and wherein said motion is precise and repeatable both at room and high temperatures.

32. The method of claim 31 wherein said aligning of said first structure with said second structure comprises:
  placing said first semiconductor wafer upon said lower support block with its first surface facing up;
  supporting said second semiconductor wafer by said upper wafer plate with its first surface facing down;
  inserting said optical microscope assembly into said fixed reference unit and focusing said first and second optical microscopes onto said fixed bottom and top reference marks, respectively;
  using said pattern recognition software to determine position and distance of said fixed top and bottom reference marks and said mirror plane angular position;
  inserting said optical microscope assembly between said first surfaces of said first and second semiconductor wafers, and focusing said second optical microscope onto said second structure of said second semiconductor wafer and then locking said optical microscope assembly position;
  moving coarse X-Y-T stage and Z-stage to focus said first microscope onto said first structure of said first semiconductor wafer and locking coarse X-Y-T and Z stages;
  using said pattern recognition software to determine position coordinates of said first and second structures and determine their offsets;
  moving fine X-Y-T stage by the amount of the determined offsets and an amount determined by a global calibration method, thereby bringing said first and second structures in alignment with each other.

33. The method of claim 32, subsequent to said alignment of said first and second structures, further comprising:
  moving said optical microscope assembly out from in between said first surfaces of said first and second semiconductor wafers;
  moving said Z-stage up while maintaining said fine X-Y-T stage alignment with feedback from said position sensors;
  bringing said first surface of said first semiconductor wafer in contact with said first surface of said second semiconductor wafer;
  clamping said first and second semiconductor wafers together; and
  unloading said aligned first and second semiconductor wafers.

34. The method of claim 32 after supporting said second semiconductor wafer by said upper wafer plate further comprising:
  moving said Z-stage up to bring said spacers on top of said first semiconductor wafer first surface in contact with said second semiconductor first surface;
  performing wedge error compensation of the second semiconductor wafer under force feedback control and locking said wedge position;
  moving said first semiconductor wafer down and removing said spacers.

35. An apparatus for aligning semiconductor wafers comprising:
  equipment for positioning a first surface of a first semiconductor wafer directly opposite to a first surface of a second semiconductor wafer;
  equipment for aligning a first structure on said first semiconductor wafer with a second structure on said first surface of said second semiconductor wafer and wherein said aligning equipment comprises at least one movable alignment device configured to be moved during alignment and to be inserted between said first surface of said first semiconductor wafer and said first surface of said second semiconductor wafer;
  an inverted U-shaped frame and a vibration isolated base, wherein said inverted U-shaped frame is supported on a top surface of said base and comprises left and right vertical columns and a first horizontal beam supported upon the tops of said vertical columns;
  a second horizontal beam arranged parallel to said first horizontal beam and comprising left and right ends and being configured to support said movable alignment device;
  wherein each of said vertical column tops comprises two parallel vertical slots extending from said column top surface toward said column center and wherein said two vertical slots are separated by a center block and wherein said center block extends from the bottom of said slots toward said column top and has a height less than the height of said vertical slots thereby forming a gap between said two vertical slots near said column top surface and wherein said left and right ends of said second horizontal beam are supported upon said center blocks of said left and right vertical columns, respectively.

36. A method for aligning for aligning semiconductor wafers comprising:
  providing an apparatus for aligning semiconductor wafers;
  positioning a first surface of a first semiconductor wafer directly opposite to a first surface of a second semiconductor wafer within said apparatus;
  providing alignment equipment comprising at least one movable alignment device; and
  aligning a first structure on said first semiconductor wafer with a second structure on said first surface of said second semiconductor wafer by inserting said movable alignment device between said first surface of said first semiconductor wafer and said first surface of said second semiconductor wafer;
  wherein said apparatus comprises an inverted U-shaped frame and a vibration isolated base, wherein said inverted U-shaped frame is supported on a top surface of said base and comprises left and right vertical columns and a first horizontal beam supported upon the tops of said vertical columns;
  wherein said apparatus further comprises a second horizontal beam arranged parallel to said first horizontal beam and comprising left and right ends and being configured to support said movable alignment device; and
  wherein each of said vertical column tops comprises two parallel vertical slots extending from said column top surface toward said column center and wherein said two vertical slots are separated by a center block and wherein said center block extends from the bottom of said slots toward said column top and has a height less than the height of said vertical slots thereby forming a gap between said two vertical slots near said column top surface and wherein said left and right ends of said second horizontal beam are supported upon said center blocks of said left and right vertical columns, respectively.

* * * * *